(12) United States Patent
Kim et al.

(10) Patent No.: US 11,322,631 B2
(45) Date of Patent: May 3, 2022

(54) SOLAR CELL PANEL

(71) Applicant: LG ELECTRONICS INC., Seoul (KR)

(72) Inventors: Chungyi Kim, Seoul (KR); Minpyo Kim, Seoul (KR); Junghoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 190 days.

(21) Appl. No.: 16/294,605

(22) Filed: Mar. 6, 2019

(65) Prior Publication Data

US 2019/0280138 A1    Sep. 12, 2019

(30) Foreign Application Priority Data

Mar. 6, 2018  (KR) .................. 10-2018-0026344
Feb. 20, 2019 (KR) .................. 10-2019-0019669

(51) Int. Cl.
| | | |
|---|---|---|
| *H01L 31/044* | (2014.01) | |
| *H01L 31/048* | (2014.01) | |
| *H02S 20/22* | (2014.01) | |
| *H01L 31/05* | (2014.01) | |
| *H02S 40/20* | (2014.01) | |

(52) U.S. Cl.
CPC ........ *H01L 31/0481* (2013.01); *H01L 31/048* (2013.01); *H01L 31/0504* (2013.01); *H02S 20/22* (2014.12); *H02S 40/20* (2014.12)

(58) Field of Classification Search
CPC ............... H01L 31/00–078; Y02E 10/50–60

USPC ................................................ 136/243–265
See application file for complete search history.

(56) References Cited

U.S. PATENT DOCUMENTS

| | | | |
|---|---|---|---|
| 2008/0006323 A1 | 1/2008 | Kalkanoglu et al. | |
| 2012/0060434 A1 | 3/2012 | Jacobs | |
| 2013/0152995 A1* | 6/2013 | Kuromiya | H01L 31/02168 |
| | | | 136/244 |
| 2014/0326292 A1* | 11/2014 | Yordem | H01L 31/048 |
| | | | 136/246 |
| 2017/0033250 A1* | 2/2017 | Ballif | F24S 20/60 |
| 2017/0345954 A1 | 11/2017 | Kang et al. | |

FOREIGN PATENT DOCUMENTS

| | | |
|---|---|---|
| CN | 104445993 A | 3/2015 |
| CN | 104860550 A | 8/2015 |
| CN | 105679912 A | 6/2016 |
| DE | 102016001628 A1 | 8/2017 |
| EP | 2693490 A1 | 2/2014 |

(Continued)

*Primary Examiner* — Bach T Dinh
(74) *Attorney, Agent, or Firm* — Birch, Stewart, Kolasch & Birch, LLP

(57) ABSTRACT

A solar cell panel can include a solar cell; a sealing member for sealing the solar cell; a first cover member disposed on the sealing member at one side of the solar cell; and a second cover member disposed on the sealing member at another side of the solar cell, in which the first cover member includes a base member and a colored portion having a light transmittance lower than a light transmittance of the base member, the first cover member constituting a colored area, and the colored portion includes at least two layers each formed of an oxide ceramic composition and having different colors or different light transmittances.

17 Claims, 22 Drawing Sheets

(56) References Cited

FOREIGN PATENT DOCUMENTS

| | | |
|---|---|---|
| JP | 58-70581 A | 4/1983 |
| JP | 6-45628 A | 2/1994 |
| JP | 2000-277774 A | 10/2000 |
| JP | 2003-110128 A | 4/2003 |
| JP | 3717369 B2 | 11/2005 |
| JP | 2012-169581 A | 9/2012 |
| WO | WO 2014/060769 A1 | 4/2014 |
| WO | WO 2015/002042 A1 | 1/2015 |
| WO | WO 2018/025249 A1 | 2/2018 |

* cited by examiner (a)

(b)

(a)   (b)

(a)

(b)

(c)

(a)

(b)

(c)

(d)

(a)            (b)

(a)                             (b)

SOLAR CELL PANEL

CROSS-REFERENCE TO RELATED APPLICATION

This application claims priority to and the benefit of Korean Patent Application No. 10-2018-0026344 filed on Mar. 6, 2018, and Korean Patent Application No. 10-2019-0019669 filed on Feb. 20, 2019, in the Republic of Korea, the entire contents of all these applications are incorporated herein by reference.

BACKGROUND OF THE INVENTION

Field of the Invention

Embodiments of the invention relate to a solar cell panel, and, more particularly, to a solar cell panel having a building integrated structure.

Description of the Related Art

Generally, a solar cell panel is installed at a rooftop or a roof of a building. However, in an apartment or a high-rise building, a size of a solar cell panel that is installed at a rooftop or a roof of a building is limited and it is difficult to efficiently use a solar light. Recently, research on a solar cell panel having a building integrated structure (a building integrated photovoltaic system BIPV) that is a solar cell panel installed on and integrated with an outer wall of a house, a building, etc. is actively carried out. By using a solar cell panel having a building integrated structure, light conversion can be performed in a wide area of an outer wall of a building, and thus, a solar light can be effectively used.

However, in order to be applied to an outer wall of a building, a solar cell panel having a building integrated structure is required to have an excellent aesthetic property even after the solar cell panel having the building integrated structure is installed. Accordingly, it is required to diversify a color of a solar cell panel having a building integrated structure or to improve an appearance of a solar cell panel having a building integrated structure. However, a solar cell or a wiring connected to the solar cell of the conventional solar cell panel having a building integrated structure may be seen from an outside as it is, or the conventional solar cell panel having a building integrated structure may only have a blue color, which is a color of a solar cell, and thus, it is difficult to improve an aesthetic property and an appearance. Moreover, when the solar cell panel is used for a long time, a yellowing phenomenon of a solar cell panel may occur and an appearance of the solar cell panel may be deteriorated. In addition, when a solar cell panel having a building integrated structure is installed on an outer wall (particularly, a vertical wall) of a building, a glazing or glaring phenomenon may occur due to a glass substrate positioned at a front surface of the solar cell panel having the building integrated structure because the solar cell panel having the building integrated structure is perpendicular to the bottom surface or the ground surface.

In order to prevent this, if a solar cell panel is colored by a layer having a thickness over a certain value, an amount of light incident to the solar cell panel is reduced, and an output of the solar cell panel may be greatly reduced. As another example, when a colored film is used as in Japanese Patent No. 3717369, a color of the colored film may be recognized differently as desired or from other members of a solar cell panel or an aesthetic property of a solar cell panel may be deteriorated when viewed from a lateral side or when viewed in a bright state.

On the other hand, even if a front surface of a solar cell panel is colored with a certain color, it may be difficult to realize a color of the solar cell panel as desired. For example, it may be difficult to realize a primary color. In addition, there is a difference in a light transmittance between a portion having a certain color and a portion having no color, and thus, a light may not be uniformly incident to a solar cell or solar cells included in a solar cell panel. Alternatively, in the case where portions having different colors are included in a solar cell panel, light transmittances of the portions having different colors may be different each other and a light may not be uniformly incident to a solar cell or solar cells included in a solar cell panel.

SUMMARY OF THE INVENTION

Therefore, embodiments of the invention have been made in view of the above problems, and embodiments of the invention are to provide a solar cell panel having an excellent appearance and a high output and being able to prevent a glare phenomenon.

More particularly, embodiments of the invention are to provide a solar cell panel including a front member having a desired color and a uniform light transmittance at an entire portion.

Also, embodiments of the invention are to provide a solar cell panel including a front member having a uniform light transmittance in a case that the front member include portions having different colors.

In a solar cell panel according to an embodiment of the invention, a first cover member includes a base member and a colored portion having a light transmittance lower than a light transmittance of the base member and constituting a colored area. In this instance, the colored portion includes at least two layers each formed of an oxide ceramic composition and having different colors or different light transmittances. This is for preventing undesired darkening at a portion where the colored layer is positioned, realizing a color of the colored layer more clearly, achieving a uniform light transmittance, or preventing a glare phenomenon. The first cover member may include a glass substrate, a front member, or an exterior member positioned at one surface of a solar cell on a sealing member for sealing the solar cell.

The solar cell panel may includes a solar cell, a sealing member for sealing the solar cell, and a second cover member positioned on the other surface of the solar cell on the sealing member.

In the embodiment, an average light transmittance of the colored portion with respect to a light in an infrared region may be the same as or larger than an average light transmittance of the colored portion with respect to a light in a visible light region, and the oxide ceramic composition of the colored portion may have a glass structure of an amorphous state.

For example, the at least two layers included the colored portion may include a first layer disposed on the base member and a second layer disposed on the first layer. Each of the first layer and the second layer includes voids. A size of the voids included in the first layer may be smaller than a size of the voids included in the second layer or a total volume of the voids included in the first layer may be smaller than a total volume of the voids included in the second layer.

In one embodiment, the colored portion may include a background layer and a colored layer stacked to each other or formed adjacent to each other. The background layer has a brightness or a light transmittance higher than that of the colored layer. The background layer may prevent undesired darkening at a portion where the colored layer is positioned, realize a color of the colored layer more clearly, achieve a uniform light transmittance, and prevent a glare phenomenon. For example, the background layer may have a white-based color or a yellow-based color, or may be transparent or translucent. The solar cell may include a plurality of solar cells, and at least a part of the background layer or the colored layer may be positioned at an inactive area where the plurality of solar cells are not positioned. The background layer may be positioned adjacent to the solar cell than the colored layer to realize a color more clearly.

In another embodiment, the colored portion may include a plurality of colored portions including a plurality of colored layers having different colors. In this instance, the solar cell may include a plurality of solar cells including a first solar cell and a second solar cell, and the plurality of colored portions may include a first colored portion positioned to correspond to the first solar cell and a second colored portion positioned to correspond to the second solar cell. A difference between an amount of current generated by the first solar cell and an amount of current generated by the second solar cell is within 10%.

For example, the plurality of colored portions may include a first colored portion and a second colored portion. The first colored portion may include a first colored layer having a first color and having a first transmittance, and the second colored portion may include a second colored layer having a second color different from the first color and having a second transmittance lower than the first transmittance. The first colored portion and the second colored portion may have different structures or different thicknesses. Thus, the first and second colored portions having different colors may have a uniform light transmittance.

As an example, a thickness of the second colored layer may be smaller than a thickness of the first colored layer.

Alternatively, the first colored portion may further include a first background layer on which the first colored layer is stacked, the second colored portion may further include a second background layer on which the second colored layer is stacked, and the first background layer and the second background layer may have different colors, different light transmittances, or different thicknesses. As an example, a thickness of the second background layer may be smaller than a thickness of the first background layer. Alternatively, a light transmittance of the second background layer may be higher than a light transmittance of the first background layer.

Alternatively, the first colored portion may further include a first background layer on which the first colored layer is stacked, and the second colored portion may be formed of the second colored portion without a background layer.

In still another embodiment, the colored portion may be formed of a colored unit including at least two colored layers having different colors or different light transmittances.

For example, the colored unit may includes a first colored layer having a first color and having a first transmittance, and a second colored layer having a second color different from the first color and having a second transmittance higher than the first transmittance. An area of the second colored layer may be the same as or larger than an area of the first colored layer.

As another example, the colored unit may include a first colored layer having a first color, a second colored layer having a second color different from the first color, and a background layer having a higher brightness than the first color and the second color and having a higher light transmittance than the first colored layer and the second colored layer.

The colored portion may be formed at a surface of the first cover member and a light diffusion portion is formed at the other surface of the first cover member.

In the embodiment, a colored portion formed of an oxide ceramic composition is included in a first cover member, and thus, an appearance and an aesthetic property of the solar cell panel can be effectively improved and also an output of the solar cell panel can be high.

Particularly, in the embodiment, the colored potion includes a background layer together with the colored layer, and thus, a portion where the colored layer is positioned can be prevented from being undesirably darkened or a color of the colored layer can be realized more clearly. In addition, a uniform light transmittance can be achieved at an entire portion of a solar cell panel due to a light scattering, and an effect of preventing a glare phenomenon can be further improved. Thus, an appearance and an output of a solar cell panel can be effectively improved.

Meanwhile, even when a plurality of colored layers or a plurality of colored portions having different colors are provided, a light transmittance can be uniform by adjusting a thickness of the colored layer, existence or non-existence of the background layer, a color of the background layer, a thickness of the background layer, or so on. Thus, an output and a stability of a solar cell panel can be excellent. In addition, even when a plurality of colored portions having different colors, different structures, or the like are provided, problems such as hot spots can be prevented from occurring and thus a reliability of a solar cell panel can be enhanced.

DETAILED DESCRIPTION OF THE EMBODIMENTS

Figure 1:
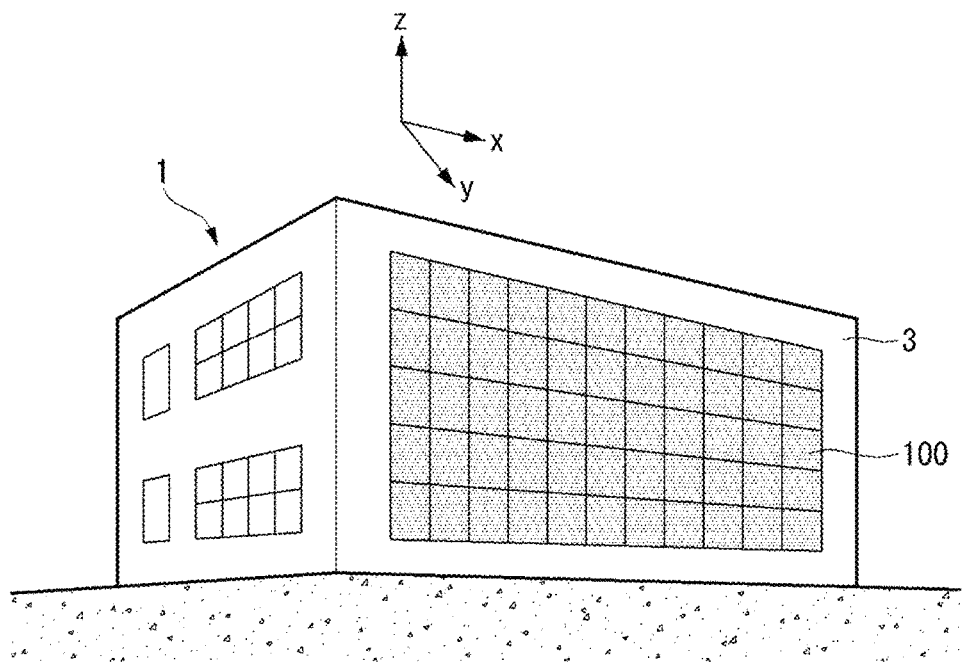
FIG. 1 is a schematic view showing an example of a building to which a solar cell panel according to an embodiment of the invention is applied.

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Hereinafter, terms "first", "second", "third" and the like are used for distinguishing each other, and embodiments of the invention are not limited to the terms.

Hereinafter, a solar cell panel according to an embodiment of the invention will be described in detail with reference to the accompanying drawings.

FIG. 1 is a schematic view showing an example of a building 1 to which a solar cell panel according to an embodiment of the invention is applied.

Referring FIG. 1, a solar cell panel 100 according to an embodiment may have a building integrated structure. That is, the solar cell panel 100 is applied to an outer wall surface (for example, a vertical wall 3, a roof surface, etc.) of a building 1. However, embodiments are not limited thereto, and the solar cell panel 100 may be installed at a rooftop of the building 1 or other places other than the building 1. The solar cell panel 100 includes a solar cell 150 (see FIG. 2) and thus generates electric power using a solar light supplied from the sun.

In the embodiment, the solar cell panel 100 may have a predetermined color, image, pattern, feeling, texture, or so on. In this instance, a predetermined color or so on of the solar cell panel 100 is provided to improve an aesthetic property of the building 1, while reducing a loss of a solar light and minimizing or preventing a decrease of solar conversion efficiency. The solar cell panel 100 will be described in more detail with reference to FIG. 2 to FIG. 4, along with FIG. 1.

Figure 2:
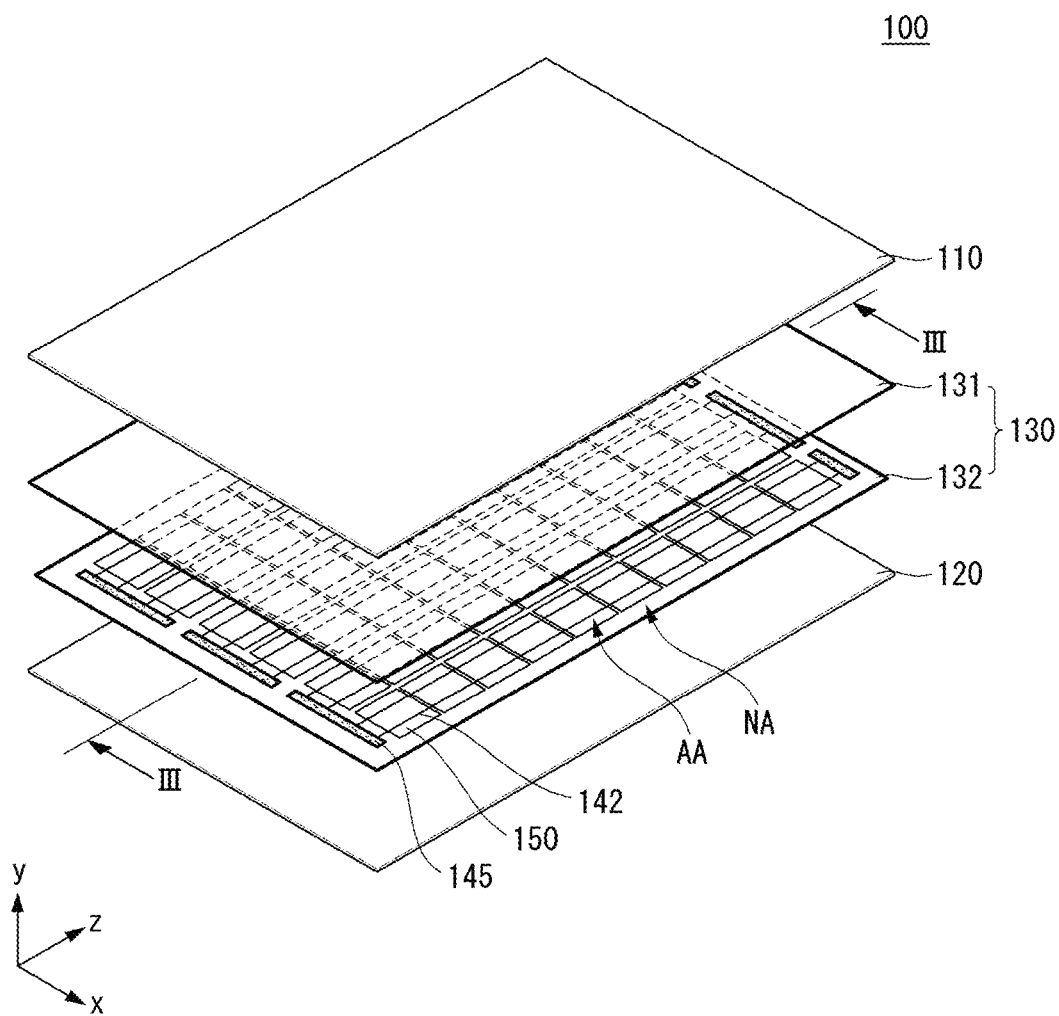
FIG. 2 is am exploded perspective view schematically showing a solar cell panel according to an embodiment of the invention.
Figure 3:
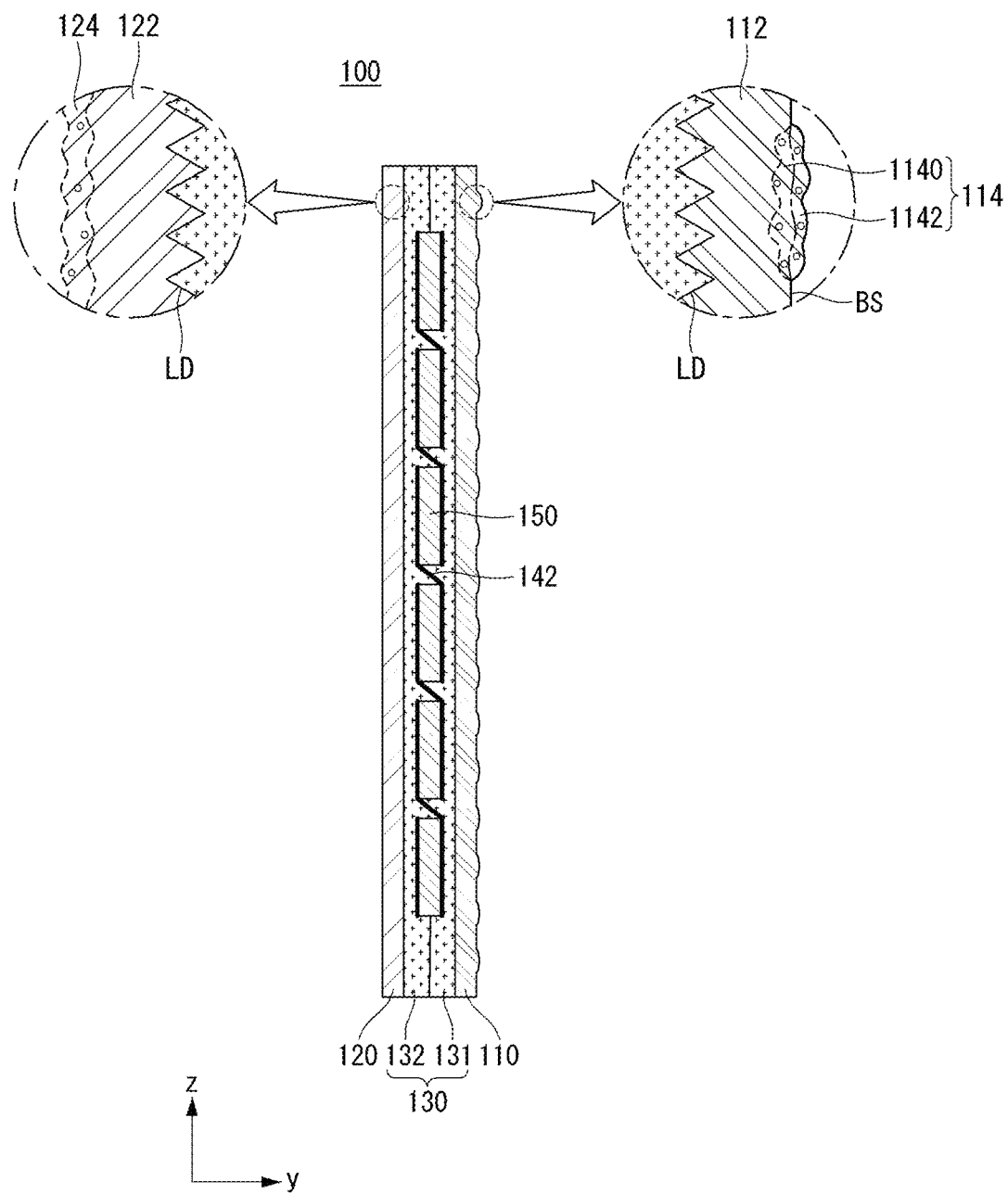
FIG. 3 is a schematically cross-sectional view taken along line III-III of FIG. 2.
Figure 4:
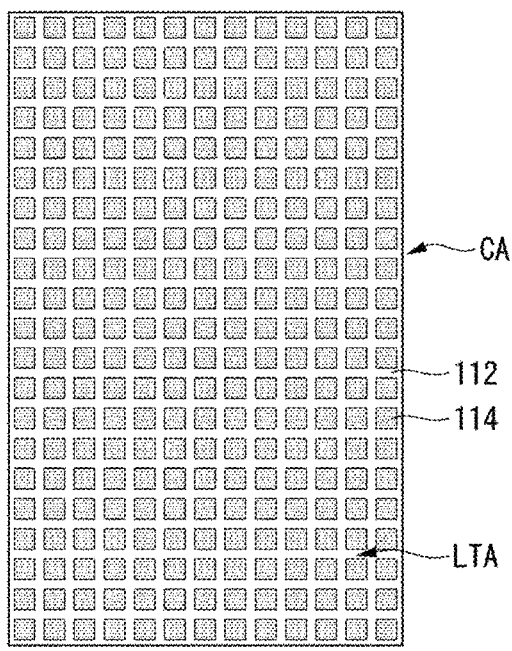
FIG. 4 is a plan view showing an example of a first cover member included in the solar cell panel shown in FIG. 2.
Figure 4:
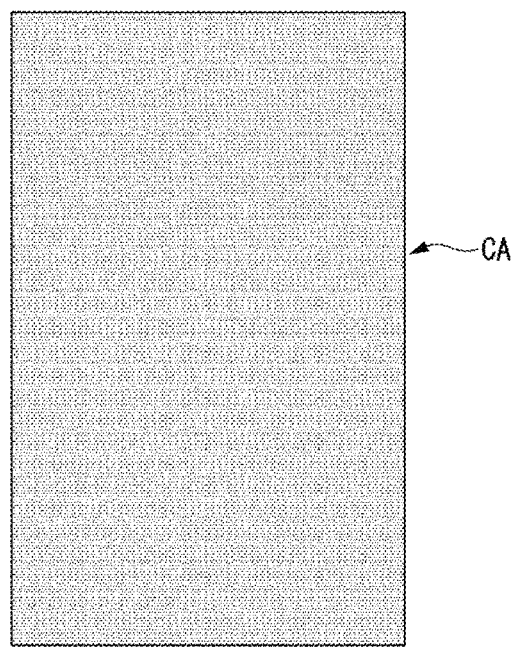

FIG. 2 is am exploded perspective view schematically showing a solar cell panel 100 according to an embodiment of the invention, and FIG. 3 is a schematically cross-sectional view taken along line III-III of FIG. 2. FIG. 4 is a plan view showing an example of a first cover member 110 included in the solar cell panel 100 shown in FIG. 2. For simplicity and clarity, a first cover member 110 and a second cover member 120 are shown in a simplified form and a colored portion 114 and a cover portion 124 are not shown in FIG. 2. A structure of the solar cell 150 is not shown in detail and only an anti-reflection layer 152 formed at a front surface of the solar cell 150 is schematically shown in FIG. 3. An actual shape of the first cover member 110 having the colored portion 114 is shown in FIG. 4(a) and a shape of the first cover member 110 when viewed at a distance from the first cover member 110 in FIG. 4(b). For reference, a schematic shape of the colored portion 114 is shown in FIG. 4(a), and a specific structure and a shape of the colored portion 114 will be described later in more detail with reference to FIG. 3, FIG. 10, and the like.

Referring to FIG. 2 and FIG. 4, a solar cell panel 100 according to an embodiment includes a solar cell 150, a sealing member 130 surrounding and sealing the solar cell 150, a first cover member (or a front member) 110 positioned at a surface (for example, a front surface) of the solar cell 150 on the sealing member 130, and a second cover member (or a back member) 120 positioned at the other surface (for example, a back surface) of the solar cell 150 on the sealing member 130.

In this instance, the solar cell 150 may include a photoelectric conversion portion that converts solar energy into electrical energy, and an electrode that is electrically connected to the photoelectric conversion portion and collects and transfers an electric current. For example, the solar cell 150 may be a solar cell that generates electrical energy from light of a wavelength range of at least 100 nm to 1400 nm (for example, 100 nm to 1200 nm). In the embodiment, for example, the photoelectric conversion portion may include a crystalline silicon substrate (for example, a single-crystalline silicon substrate or wafer) and a conductive region formed on or at the crystalline silicon substrate and including a dopant or a conductive region including an oxide. The solar cell 150 based on a crystalline silicon substrate having a high degree of crystallinity and having few defects has excellent electrical properties.

In the embodiment, a plurality of solar cells 150 are spaced apart from each other and may be electrically connected in series, parallel, or series-parallel by an interconnector 142 and 145. For example, a plurality of solar cells 150 may be connected in series to form a solar cell string extending along one direction. Any of various structures and shapes for connecting the solar cells 150, such as a ribbon and a wire, may be applied to the interconnector 142 and 145. Embodiments are not limited to a number, a structure, a shape, and the like of the interconnector 142 and 145.

However, embodiments are not limited thereto, and a structure, a type, etc. of the solar cell 150 may be variously modified. For example, the solar cell 150 may have any of various structures such as a compound semiconductor solar cell, a thin-film semiconductor solar cell, and a dye-sensitized solar cell. It is also possible that only one solar cell 150 is provided in a solar cell panel 100.

In the embodiment, an anti-reflection layer 152 is provided at a front surface of the solar cell 150 to prevent light from reflecting. The solar cell 150 may have a certain color (for example, blue, black, etc.) due to a constructive interference caused by the anti-reflection layer 152. The interconnects 142 and 145 may be formed of metal. Accordingly, if the first cover member 110 is formed only of a glass substrate, a boundary between an active area AA where the solar cell 150 is positioned and an inactive area NA where the solar cell 150 is not positioned may be easily recognized. Then, an aesthetic property of the solar cell panel 100 may be deteriorated. Accordingly, in the embodiment, a colored portion 114 or a cover portion 124 is formed on or at the first or second cover member 110 or 120, which will be described later in detail.

For example, if the anti-reflection layer 152 of the solar cell 150 may have a stacked structure having a plurality of layers, which may be formed of an oxide, a nitride, or a carbide (such as, a silicon oxide, a silicon nitride, or a silicon carbide), silicate, or amorphous silicon. Alternatively, the anti-reflection layer 152 of the solar cell 150 may have a structure in which a plurality of insulating layers formed of an oxide or an oxynitride including silicon, titanium, aluminum, zirconium, zinc, antimony, or copper are stacked. When the anti-reflection layer 152 is formed of an oxide or a nitride oxide, a layer including a silicon nitride and/or a layer including a silicon carbonitride may be further provided inside or outside the anti-reflection layer 152 to prevent problems caused by ultraviolet rays, moisture, etc. However, embodiments of the invention are not limited thereto, and the anti-reflection layer 152 may have any of various materials, any of stacked structures, and the like.

The first cover member 110 is disposed on the sealing member 130 (for example, a first sealing member 131) to constitute one surface (for example, a front surface) of the solar cell panel 100, and the cover member 120 is disposed on the sealing member 130 (for example, a second sealing member 132) to constitute the other surface (for example, a back surface) of the solar cell panel 100. Each of the first cover member 110 and the second cover member 120 may be formed of an insulating material capable of protecting the solar cell 150 from external impact, moisture, ultraviolet rays, or the like. A specific structure of the first and second cover members 110 and 120 will be described later in detail.

The sealing member 130 includes a first sealing member 131 positioned on the front surface of the solar cell 150 and a second sealing member 132 positioned on the back surface of the solar cell 150. The first sealing member 131 and the second sealing member 132 prevent moisture and oxygen from entering and chemically bind each element of the solar cell panel 100. The first and second sealing members 131 and 132 may be formed of an insulating material having translucency (for example, transparency) and adhesiveness. For example, the first sealing member 131 and the second sealing member 132 may be formed of an ethylene-vinyl acetate copolymer resin (EVA), a polyvinyl butyral, a silicone resin, an ester resin, an olefin resin, or so on. The second cover member 120, the second sealing member 132, the plurality of solar cells 150 connected by the interconnector 142 and 145, the first sealing member 131, and the first cover member 110 may be integrated through a lamination process using the first and second sealing members 131 and 132 or so on to constitute the solar cell panel 100.

However, embodiments are not limited thereto. Accordingly, the first or second sealing member 131 or 132 may include any of various materials other than those described above and may have any of various shapes.

In the embodiment, the first and second cover members 110 and 120 or may have a predetermined structure so that the solar cell panel 100 has a desired appearance such as a predetermined color, image, pattern, feeling, texture, or so on or so that the solar cell 150 or the interconnectors 142 and 145 connected thereto is prevented from being clearly recognized.

The first cover member 110 may have a light transmitting property that allows light to pass therethrough so as not to block the light incident on the solar cell 150. More particularly, the first cover member 110 may include a first base member 112 and a colored portion 114 formed on the first base member 112. The colored portion 114 may include or be formed of an oxide ceramic composition to form a desired appearance. The colored portion 114 may prevent the solar cell 150 or the interconnectors 142 and 145 connected thereto from being clearly recognized while the solar cell panel 100 has a desired appearance.

The second cover member 120 may have excellent fire resistance and insulating property. More particularly, the second cover member 120 may include a second base member 122 and a cover portion 124 formed on the second base member 122. The cover portion 124 may serve to prevent the solar cell 150 or the interconnectors 142 and 145 connected thereto from being clearly recognized.

In this instance, the first base member 112 may be formed of a material having an excellent light transmittance (for example, a transparent material). For example, the first base member 112 may be a substrate, a film, a sheet, or the like, which is formed of glass, a resin (e.g., polycarbonate), or the like. The first base member 112 may be formed of a single layer or a plurality of layers. The second base member 122 may be formed of a material having excellent fire resistance, insulating property, or the like. The second base member 122 may be a substrate, a film, a sheet, or the like formed of glass, a resin or the like.

More particularly, the first and second base member 112 and 122 may be formed of a glass substrate having excellent transparency, insulating property, stability, durability, fire resistance and the like. For example, each of the first and second base member 112 and 122 may be a low-iron glass substrate (for example, a low-iron tempered glass substrate) having a light transmittance of 80% or more (for example, 85% or more) for light having a wavelength of 380 nm to 1200 nm. By using a low-iron glass substrate including less iron, a reflection of a solar light can be prevented and a light transmittance of a solar light can be increased. When a low-iron tempered or semi-tempered glass substrate is used, the solar cell 150 can be effectively protected from an external impact or the like.

In this instance, when the solar cell panel 100 is used as an exterior material of the building 1, the first or second cover member 110 or 120 or the solar cell panel 100 should have sufficient strength so that the solar cell panel 100 can withstand external impacts such as wind pressure, hail, snow load, and so on. For this purpose, the first or second cover member 110 or 120 or the first or second base member 112 or 122 may have a deflection of 5 mm or less generated in a direction of receiving a force when a force of 2400 $Nm^2$. If the deflection exceeds 5 mm, durability against external impact such as wind pressure, hail, snow load, and so on may be not sufficient, and thus, it may be difficult to use as the exterior material of the building 1.

In one example, the first or second base member 112 or 122 may have a thickness of 2.8 mm or more, for example, 2.8 mm to 12 mm (more particularly, 2.8 mm to 8 mm), and may have an area of 0.04 to 10 $m^2$. If the first or second thickness of the base member 112 or 122 is less than 2.8 mm, it may be difficult for the solar cell panel 100 to withstand an external impact or to have sufficient durability to be applied to the building 1. If the thickness of the first or second base member 112 or 122 exceeds 12 mm, weight of the solar cell panel 100 may increase and it may be difficult to apply the solar cell panel 100 to the building 1. The area of the first or second base member 112 or 122 is limited in consideration of structural stability, productivity, and the like of the solar cell panel 100.

However, embodiments are not limited thereto, and the deflection, thickness, area, and the like of the first or second base member 112 or 122 may have any of various values.

In the embodiment, the colored portion 114 having a lower light transmittance than the first base member 112 and forming a colored area may be formed on or at the first base member 112. In this instance, the colored portion 114 is a portion formed so that the solar cell panel 100 has a desired color, image, pattern, feeling, texture, or so on. For example, the colored portion 114 may have a certain color, for example, may have an achromatic color such as white, gray, black, etc., or a chromatic color such as red, yellow, green, blue, etc. The colored portion 114 can prevent the solar cell 150 or the interconnectors 142 and 145 connected thereto from being clearly recognized from the outside. The cover portion 124 may be formed on the second base member 122. The cover portion 124 may have a color that can prevent the solar cell 150 or the interconnectors 142 and 145 connected thereto from being clearly recognized from the outside.

In the embodiment, each of the colored portion 114 and the cover portion 124 may be formed of an oxide ceramic composition.

In this instance, the colored portion 114 may include at least two layers each formed of an oxide ceramic composition and having different colors or light transmittances. For example, in the embodiment, the colored portion 114 may include a background layer (a base layer) 1140 and a colored layer 1142 stacked to each other. In this instance, the background layer 1140 may be formed of an oxide ceramic composition, and the colored layer 1142 may be formed of an oxide ceramic composition including a material, a composition, or the like different from that of the background layer 1140.

For example, the colored layer 1142 may be a layer having a certain color to realize a desired color. For example, the colored layer 1142 may have a certain color, that is, may have an achromatic color such as white, gray, black, etc., or a chromatic color such as red, yellow, green, blue, etc., to have a certain color.

The background layer 1140 may provide a background color to increase a brightness of a portion where the colored layer 1142 is formed and thus to prevent the portion where the colored layer 1142 is positioned from being undesirably darkened, or realize a color of the colored layer 1142 more clearly. For example, when the colored layer 1142 has a primary color, the primary color of the colored layer 1142 can be brightly and clearly realized by the background layer 1140. The background layer 1140 can also control a light transmittance of the colored layer 1142 so that an entire portion of the solar cell panel 100 has a uniform light transmittance. Further, an effect of preventing a glare phenomenon can be further improved by the background layer 1140.

For example, the background layer 1140 may have a background color having a different color (for example, a color having a different brightness and/or saturation) from the colored layer 1142, or may have a higher light transmittance than the colored layer 1142. For example, the background layer 1140 may have a background color (e.g., a white-based color or a yellow-based color) having a higher brightness than the colored layer 1142. In this instance, a white-based color or a yellow-based color may mean white, yellow, or a color which is basically white or yellow, mixed with slightly different colors and considered to be white or yellow as a whole. Alternatively, the background layer 1140 may be transparent or translucent. For example, when the background layer 1140 is translucent, a difference in a light transmittance (e.g., an average light transmittance) between the background layer 1140 and the first base member 112 may be within 10% (e.g., within 5%). When the difference in the light transmittance exceeds 10% (for example, 5%), the difference in light transmittance between the portion where the background layer 1140 is formed and the portion where the background layer 1140 is not formed becomes large, it may be difficult to uniformly generate a current. However, embodiments of the invention are not limited thereto.

For example, when the background layer 1140 has a white-based color or a yellow-based color (in particular, a white-based color), a light reaching the background layer 1140 can be scattered widely. According to this, even when the colored portion 114 is provided, a light can be scattered and the light can be uniformly supplied to the solar cell 150. At least a part of the background layer 1140 or the colored portion 114 including the background layer 1140 may be positioned at least at an inactive area NA. Then, the background layer 1140 or the colored portion 114 including the background layer 1140 can scatter a light incident to the inactive area NA and change a path of the light toward the solar cell 150 positioned in an active area AA. Accordingly, if the background layer 1140 or the colored portion 114 including the background layer 1140 having a white-based color or a yellow-based color is formed at least at the inactive area NA, an output of the solar cell panel 100 can be improved or can be maintained not to be decreased below a predetermined level.

In this instance, the background layer 1140 may be positioned adjacent to the solar cell 150 rather than the colored layer 1142. That is, the colored layer 1142 is positioned in a direction in which the light is incident and the background layer 1140 is positioned behind the background layer 1140, and thus, an effect improving brightness or assisting a color realization of the colored layer 1142 can be effectively performed by the background layer 1140. In FIG. 3, it is exemplified that the colored layer 114 is positioned on or at an outer surface of the first base member 112 and thus the background layer 1140 is positioned on the first base member 112 and the colored layer 1142 is formed on the background layer 1140. Then, a glare phenomenon that may occur when the solar cell panel 100 positioned is applied to the building 1 can be prevented or minimized by the colored portion 114 positioned at an outer surface of the first cover member 110. Also, the background layer 1140 may be firstly formed on the first base member 112 and thus the colored layer 1142 can be formed more stably. However, embodiments of the invention are not limited thereto. Modified examples thereof will be described in detail with reference to FIG. 12 and FIG. 13 later.

As an example, a thickness of the colored layer 1142 may be the same as or greater than a thickness of the background layer 1140. In particular, a thickness of the colored layer 1142 may be greater than a thickness of the background layer 1140. Then, the thickness of the colored layer 1142 can be sufficiently secured, and thus, the color by the colored portion 114 can be stably realized. Since the effect by the background layer 1140 can be sufficiently realized when the background layer 1140 has a small thickness, the background layer 1140 may be relatively thin so as to minimize decrease of a light transmittance and minimize a material cost. However, embodiments of the invention are not limited thereto. Therefore, a thickness of the colored layer 1142 may be smaller than a thickness of the background layer 1140. According to this, a thickness of the colored layer 1142 having a relatively low light transmittance is small and thus a light transmittance can be maintained high while an effect of the background layer 1140 is sufficiently realized. Various other variations are possible.

The cover portion 124 may have a color that prevents the solar cell 150 or the interconnectors 142 and 145 connected thereto from being clearly recognized from the outside or like. Thus, the cover portion 124 may be formed of a single colored layer, not including an additional background layer 1140 or so on. However, embodiments of the invention are not limited thereto, and the cover portion 124 may also be formed of a plurality of layers.

Hereinafter, a colored portion 114 formed of an oxide ceramic composition as described above will be described in detail, and then, a cover portion 124 will be described in detail. A description commonly applied to the colored layer 1142 and the background layer 1140 is hereinafter referred to as a colored portion 114, and a colored layer 1142 or a background layer 1140 is specified in the description applied to only one of the colored layer 1142 and the background layer 1140.

In the embodiment, a colored portion 114 (that is, a colored layer 1142 and a background layer 1140, respectively) may be formed of an oxide ceramic composition. More specifically, the oxide ceramic composition constituting the colored portion 114 may have an amorphous glass structure (a glass structure of an amorphous state). For example, the colored portion 114 may be formed of a glassy oxide ceramic composition.

Hereinafter, with reference to FIG. 5 and FIG. 6A to FIG. 6D together with FIG. 1 to FIG. 4, a forming method of a colored portion 114 (particularly, a colored portion 114 including a background layer 1140 and a colored layer 1142) formed of an oxide ceramic composition having an amorphous glass structure on or at the first base member 112 (that is, a manufacturing method of a first cover member 110 including a colored portion 114 according to the embodiment) will be described in detail, and the colored portion 114 manufactured by the same will be described in detail.

Figure 5:
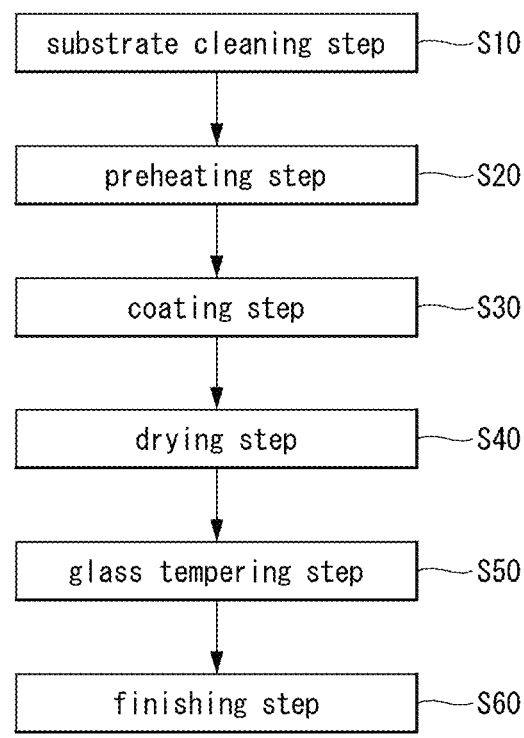
FIG. 5 is a flow chart showing an example of a manufacturing method of a first cover member included in a solar cell panel according to an embodiment of the invention.

FIG. 5 is a flow chart showing an example of a manufacturing method of a first cover member 110 included in a solar cell panel 100 according to an embodiment of the invention, and FIGS. 6A to 6D are cross-sectional views showing steps of the manufacturing method of the first cover member 110 shown in FIG. 5, respectively. For simplicity, it is shown that the colored portion 114 is formed as a whole in FIGS. 6A and 6D, but an actual shape of the colored portion 114 may be variously modified.

Referring to FIG. 5, a manufacturing method of the first cover member 110 according to the embodiment includes a substrate cleaning step S10, a preheating step S20, a coating step S30, a drying step S40, a glass tempering step S50, and a finishing step S60. When a colored portion 114 includes a background layer 1140 and a colored layer 1142 stacked to each other as in the embodiment, the background layer 1140 and the colored layer 1142 may be formed by repeatedly performing the coating step S30 and/or the drying step S40 after the preheating step S20, and then, the glass tempering step S50 may be performed. This will be described in more detail later.

Figure 6A:
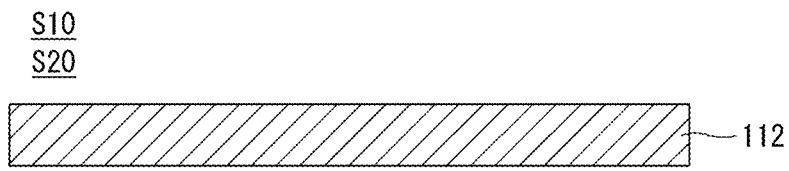
FIGS. 6A to 6D are cross-sectional views showing steps of the manufacturing method of the first cover member shown in FIG. 5, respectively.

As shown in FIG. 6A, in a substrate cleaning step S10, a first base member 112 formed of a non-tempered glass substrate (an unreinforced glass substrate) is cleaned and dried. Foreign matters, an oil film, or the like on the first base member 112 can be removed by the substrate cleaning step S10.

In this instance, the non-tempered glass substrate may have a light transmittance of 80% or more (for example, 85% or more) to a light having a wavelength of 380 nm to 1200 nm and a thickness of 2.8 mm or more. As an example, the non-tempered glass substrate may be a non-tempered glass substrate for construction, and may be prepared by a cutting, chamfering, or surface-etching process.

A preheating step S20 for preheating the first base member 112 at a temperature lower than that of a drying step S40 or a glass tempering step S50 may be performed after a substrate cleaning step S10. As an example, the first base member 112 may be preheated to a temperature of 25 to 150° C. during a process that the first base member 112 is supplied to an apparatus for a coating step S30. In this instance, the preheating may be performed by directly heating the first base member 112, or may be performed using an infrared heating apparatus or the like. When the preheating is performed to the first base member 112, a colored forming layer 113 (see FIG. 6B) including a ceramic frit (a glass frit) 1134 (see FIG. 6B) can be uniformly applied and an adhesion property of the colored forming layer 113 can be improved.

Figure 6B:
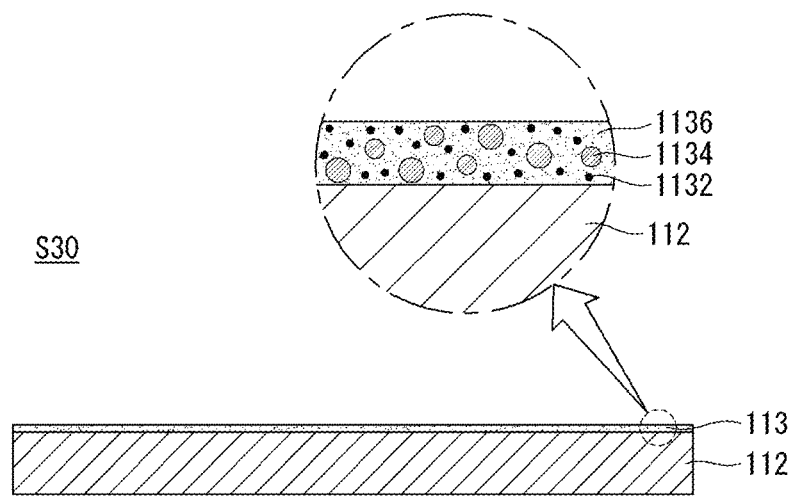
Figure 6C:
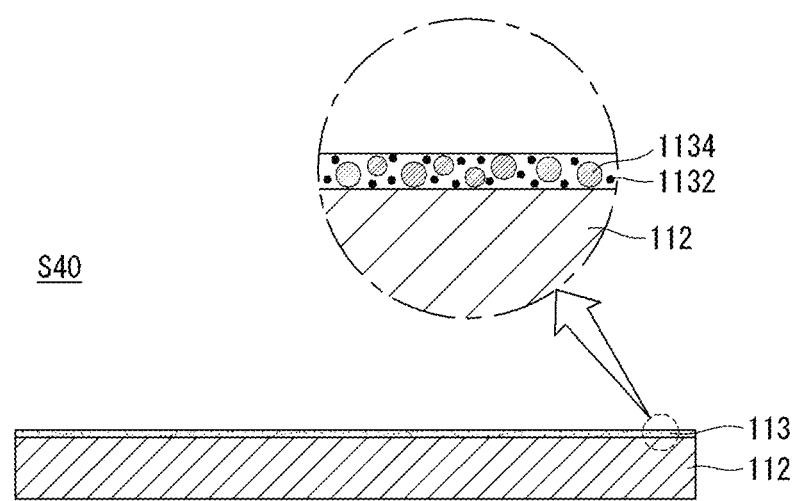

Next, as shown in FIGS. 6B and 6C, in the coating step S30 and the drying step S40, a colored forming layer 113 is formed by coating a ceramic material layer (a ceramic ink, a ceramic paste, a ceramic solution, or the like) including a ceramic frit 1134, a coloring material 1132 and a resin 1136 on the first base member 112 and the drying the same.

The ceramic material layer may further include an additive and the like in addition to the ceramic frit 1134, the coloring material 1132, and the resin 1136 described above. As an additive, any of various materials such as oxides and metals may be included in consideration of desired properties. A wax, water, oil, an organic solvent, a viscosity-adjusting diluent, or so on for adjusting a viscosity may be included as an additive. In this instance, the ceramic frit 1134 basically serves to stably bind the colored portion 114 to the first base member 112 (particularly, a glass substrate), and may selectively provide a specific color, texture, feeling, or so on.

The ceramic frit 1134 is a compound including a plurality of metals and a non-metal, and may be formed by including a plurality of metal compounds. The ceramic frit 1134 may be formed of an oxygen polyhedron having a random network structure or a glass structure including a plurality of metals and oxygen. When each of the plurality of metal compounds is formed of a metal oxide, a random network structure or a glass structure can be easily and stably formed. The phrase of "the ceramic frit 1134 is formed by including a plurality of metal compounds (for example, a plurality of metal oxides)" in this specification means that ceramic frit 1134 is manufactured using a plurality of metal compounds (for example, a plurality of metal oxides) and thus the ceramic frit 134 is formed to at least partially include a compound structure, a random network structure, a glass structure, or the like including a plurality of metals and a non-metal (e.g., oxygen).

The ceramic frit 1134 may include any of various materials known in the art. For example, the ceramic frit 1134 may be formed by including a silicon oxide (SiOx, for example, $SiO_2$), and at least one of an aluminum oxide (AlOx, for example, $Al_2O_3$), a sodium oxide (NaOx, for example, $Na_2O$), a bismuth oxide (BiOx, for example, $Bi_2O_3$), a boron oxide (BOx, for example, $B_2O$) and a zinc oxide (ZnOx, for example, ZnO) as a base material. Besides, the ceramic frit 1134 may be formed by further including an aluminum oxide, a sodium oxide, a bismuth oxide, a boron oxide, a zinc oxide, a titanium oxide (TiOx, for example, $TiO_2$), a zirconium oxide (ZrOx, for example, $ZrO_2$) a potassium oxide (KOx, for example, $K_2O$), a lithium oxide (LiOx, for example, $Li_2O$), a calcium oxide (CaOx, for example, CaO), a cobalt oxide (CoOx), an iron oxide (FeOx), or the like. For example, the ceramic frit 113 may be formed of a bismuth boro-silicate based ceramic material (e.g., a $Bi_2O_3$—$Al_2O$—$SiO_2$ based material) which is formed by including a bismuth oxide, a boron oxide, and a silicon oxide. Alternatively, the ceramic frit 1134 may be formed of a sodium boro-silicate based ceramic material (e.g., a $Na_2O$—$B_2O_3$—$SiO_2$ based material) which is formed by including a sodium oxide, a boron oxide, and a silicon oxide. Alternatively, the ceramic frit 1134 may be formed of a NaOS based ceramic material (for example, a $Na_2O$—$Al_2O_3$—$SiO_2$ based material) which is formed by including a sodium oxide, an aluminum oxide, and a silicon oxide. Alternatively, the ceramic frit 1134 may be formed of a ceramic material (for example, a ZnO—$SiO_2$—$B_2O_3$ based material) which is formed by including a zinc oxide, a silicon oxide, and a boron oxide. However, embodiments of the invention are not limited thereto, and the ceramic frit 1134 may be formed of any of various other materials.

The coloring material 1132 may be included in the colored portion 114 (particularly, the colored layer 1142) so that the colored portion 114 has a desired appearance. For example, when the colored portion 114 has a predetermined color, a material capable of selectively absorbing or reflecting visible light of solar light to exhibit a predetermined color may be used as the coloring material 1132. In one example, the coloring material 1132 may be a pigment. A pigment is a coloring material formed of an inorganic material which is not soluble in water and most organic solvents, and exhibits a color by covering or coating a surface of the first base member 112. Pigments are excellent in chemical resistance, light resistance, weather resistance, and hiding power. That is, the pigment is strong against bases and acids, does not discolor and fade well when exposed to ultraviolet light, and can withstand the weather. For reference, if a dyestuff formed of an organic material dissolved in water or an organic solvent is used as a coloring material, a molecular structure may be easily broken by solar light and a stability may be deteriorated, and a protective layer or the like for protecting it is needed to be formed, which may complicate a manufacturing process. Thus, embodiments of the invention are not limited thereto, and thus the coloring material 1132 may include any of various materials such as a dyestuff The coloring material 1132 may be formed of a material in consideration of the desired appearance of the colored portion 114. Although it is exemplified that the coloring material 1132 is separately provided from the ceramic frit 1134, embodiments of the invention are not limited thereto. For example, the desired appearance of the colored portion 114 may be realized by a material constituting the ceramic frit 1134, and the coloring material 1132 may not be provided separately from the ceramic frit 1134. Alternatively, a distinction between the ceramic frit 1134 and the coloring material 1132 may not be clear. In the embodiment, a metal of a material included in the coloring material 1132 may partially replace a metal of a random network structure or a glass structure (for example, an oxygen polyhedron) constituting the ceramic frit 1134 and thus the metal of the material included in the coloring material 1132 may be included in the random network structure or the glass structure (for example, the oxygen polyhedron). Alternatively, a metal included in the coloring material 1132 may be positioned at an interstitial site of a random network structure, a glass structure, or an oxygen polyhedron of the ceramic frit 1134.

For example, when the colored portion 114 or the colored layer 1142 or the background layer 1140 included therein has a color other than white, the colored portion 114, the colored layer 1142, or the background layer 1140 may include any of various coloring materials 1132. That is, one or two or more materials corresponding to the desired color may be used as the coloring material 1132. A material constituting the coloring material 1132 may be in a form of a metal, or a oxide, a carbide, a nitride, a sulfide, a chloride, a silicate, or the like including a metal.

For example, a material including at least one of copper (Cu), iron (Fe), nickel (Ni), chromium (Cr), uranium (U), vanadium (V), and the like may be used as the coloring material 1132 to exhibit a color of a series of red, yellow, or so on. A material including at least one of titanium (Ti), magnesium (Mg), and rutile may be used as the coloring material 1142 to exhibit a color of a series such as green, blue, or so on. In addition, the coloring material 1132 may be include a cobalt oxide, an iron oxide, a copper oxide (CuOx), a chromium oxide (CrOx), a nickel oxide (NiOx), a manganese oxide (MnOx), a tin oxide (SnOx), an antimony oxide (SbOx), a vanadium oxide (VOx), or the like.

As a more specific example, as the coloring material 1132, $CoAl_2O_4$ may be used to realize cyan, $Co_2SiO_4$ or the like may be used to realize blue, $Co_2Cr_2O_4$ may be used to realize green, Ti(Cr, Sb)$O_2$ may be used to realize yellow, or $CoFe_2O_4$ or Co—Cr—Fe—Mn spinel may be used to realize black. Alternatively, as the coloring material 1132, NiO, $Cr_2O_3$, or the like may be used to realize green, Cr—Al spinel, Ca—Sn—Si—Cr spin, Zr—Si—Fe zircon or the like may be used to realize pink, or Sn—Sb—V rutile may be used to realize gray, Ti—Sb—Ni rutile, Zn—V baddeleyite, or the like may be used to realize yellow, Co—Zn—Al may be used to realize blue, Zn—Fe—Cr spinel may be used to realize brown, or Ca—Cr—Si garnet may be used to realize green. Alternatively, as the coloring material 1132, Co—Zn—Si willemite, Co—Si olivine, or the like may be used to realize dark blue, Zn—Fe—Cr—Al spinel or the like may be used to realize brown, or Au or the like may be used to realize magenta. Such a material is merely one example, and embodiments of the invention are not limited thereto.

In the above description, it is exemplified that the colored portion 114, the colored layer 1142, or the background layer 1140 has a certain color other than white. However, embodiments of the invention are not limited thereto.

Thus, the colored portion 114 or the background layer 1140 included therein may be transparent or translucent (semi-transparent), may be glossy or non-glossy, express a specific texture, or prevent a glare phenomenon. In this instance, the coloring material 1132 may be included in the colored portion 114 or the background layer 1140, but the coloring material 1132 may not be included in the colored portion 114 or the background layer 1140. In this instance, when the colored portion 114 or the background layer 1140 does not have a white color, the ceramic frit 1134 included in the colored portion 114 or the background layer 1140 may not include a lead oxide, an aluminum oxide, or the like, which may exhibit white. For example, when the colored portion 114 or the background layer 1140 is transparent or translucent, the ceramic frit 1134 included therein may include a sodium oxide, a silicon oxide, or the like. When the colored portion 114 or the background layer 1140 is transparent or translucent, the ceramic frit 1134 included therein may be formed of a ceramic material (NaOx—SiOx—$B_2O$ based material) including a sodium oxide, a silicon oxide, and a boron oxide, A titanium oxide and a bismuth oxide are materials that may be used to realize white, but even if some are included, the colored portion 114 or the background layer 1140 may be kept transparent or translucent. However, even when the colored portion 114 or the background layer 1140 is transparent or translucent, a pigment or a coloring material 1132 may be used for realizing color slightly (for example, translucent with red, transparent with green, etc.).

Alternatively, the colored portion 114, or the colored layer 1142 or the background layer 1140 included therein may have a white-based color (for example, a white color) by a metal compound (for example, a metal oxide) included in the ceramic frit 1134. For example, when the ceramic frit 1134 is formed by including at least one of a lead oxide (PbOx, for example, PbO), a titanium oxide, an aluminum oxide, and a bismuth oxide, the colored portion 114, or the colored layer 1142 or the background layer 1140 may have a white color. In this instance, when the colored portion 114, the colored layer 1142, or the background layer 1140 has a white color, it may further include a material such as boron oxide in addition to the above-described material. In particular, when the background layer 1140 has a white color, a light scattering effect can be excellent when the background layer 1140 includes a bismuth oxide, and the light scattering effect can be further improved by further including a boron oxide. For example, when the colored portion 114, the colored layer 1142, or the background layer 1140 has a white color, a ceramic frit 1134 may be formed of a ceramic material (BiOx—SiOx—$B_2O$ based material) which is formed by including a bismuth oxide, a silicon oxide, and a boron oxide, a ceramic material (PbOx—SiOx—$B_2O$ based material) which is formed by including a lead oxide, a silicon oxide, and a boron oxide, a ceramic material (TiOx—SiOx—$B_2O$ based material) which is formed by including a titanium oxide, a silicon oxide, and a boron oxide, a ceramic material (AlOx—SiOx—$B_2O$ based materials) which is formed by including an aluminum oxide, a silicon oxide, and a boron oxide. However, the lead oxide may not be included in the colored portion 114, the colored layer 1142 or the background layer 1140, or the ceramic frit 1134 included therein according to the embodiment in consideration of environmental problems.

The resin 1136 may be a material used to uniformly mix the coloring material 1132 and the ceramic frit 1134. Also, the resin 1136 may be used so that the ceramic material layer has appropriate viscosity, fluidity, and the like when the ceramic material layer is applied. The resin 1146 may include any of various materials known as a resin. For example, as the resin 1136, an organic resin such as an acrylic resin, a cellulose resin, or so on may be used, or an inorganic resin such as a silicone resin may be used.

Each ceramic material layer constituting the colored portion 114 (for example, a ceramic material layer constituting the background layer 1140 or constituting the colored layer 1142) includes a ceramic frit 1134 with the largest amount. In the case that the coloring material 1132 is included, an amount of the coloring material 1132 may be smaller than an amount of the ceramic frit 1134. For example, when the coloring material 1132 is included, the ceramic frit 1134 may be included in an amount of 40 to 90 parts by weight (for example, 50 to 90 parts by weight), the coloring material 1132 may be included in an amount of 5 to 50 parts by weight, and the resin 1136 and/or an additive may be included in an amount of 0 to 20 parts by weight with respect to 100 parts by weight of each ceramic material layer. When the coloring material 1132 is not included, the ceramic frit 1134 may be included in an amount of 50 to 100 parts by weight (for example, 60 to 100 parts by weight), and the resin 1136 and/or an additive may be included in an amount of 0 to 50 parts by weight (for example, 0 to 40 parts by weight) with respect to 100 parts by weight of each ceramic material layer. However, embodiments of the invention are not limited thereto, and each ceramic material layer may have various compositions.

Each the ceramic material layer may be applied to or coated on the first base member 112 by a spraying process, a printing process, or a sol-gel process. For example, a printing process may be an inkjet printing process (for example, a digital inkjet printing process), a lithography printing process, a laser printing process, a screen printing process, or the like. According to the printing process, each ceramic material layer can be stably formed with a desired thickness by a simple process. However, embodiments of the invention are not limited thereto, and various layers of the ceramic material may be applied by various other methods.

In the drying step S40, heat is applied to volatilize the resin 1136 while drying the ceramic material layer or the colored forming layer 113. The resin 1136 or the like is first volatilized so that the coloring material 1132, the ceramic frit 1134 or so on can be effectively mixed together with the first base member 112. In the drying step S40, all of the resin 1136 may be removed, or a part thereof may remain. In this instance, voids (bubbles, or so on) 114V (see FIG. 6D) formed of empty spaces may remain in at least a part of a portion where the resin 1138 is removed. For example, in the drying step S40, the ceramic material layer or the colored forming layer 113 may be dried at a temperature of 50 to 200° C. The drying step S40 may be carried out using an infrared heating apparatus, ultraviolet curing, or the like. However, embodiments of the invention are not limited thereto, and a drying temperature, a drying method, or the like may be variously changed.

In the embodiment, the colored forming layer 113 may be formed by repeating the coating step S30 and/or the drying step S40. That is, when the colored portion 114 includes the background layer 1140 and the colored layer 1142 stacked to each other, a ceramic material layer for the background layer 1140 is coated and dried, and then, a ceramic material layer for a colored layer 1142 is coated and dried to form the colored forming layer 113. In this instance, the ceramic material layer for the background layer 1140 and the ceramic material layer for the colored layer 1142 may include the coloring material 1132 for the desired color or the like, or may not include a coloring material 1132. The ceramic material layer for the background layer 1140 and the ceramic material layer for the colored layer 1142 may include the ceramic frit 1134, the resin 1136, or the like of the same material or with the same amount. The ceramic material layer for the background layer 1140 and the ceramic material layer for the colored layer 1142 may include the ceramic frit 1134, the resin 1136, or the like of different materials or with different amounts.

However, embodiments of the invention are not limited thereto. A ceramic material layer for the background layer 1140 is coated, a ceramic material layer for the colored layer 1142 is coated on the ceramic material layer for the background layer 1140, the background layer 1140, and the ceramic material layer for the background layer 1140 and the ceramic material layer for the colored layer 1142 may be dried together. Various other variations are possible.

Figure 6D:
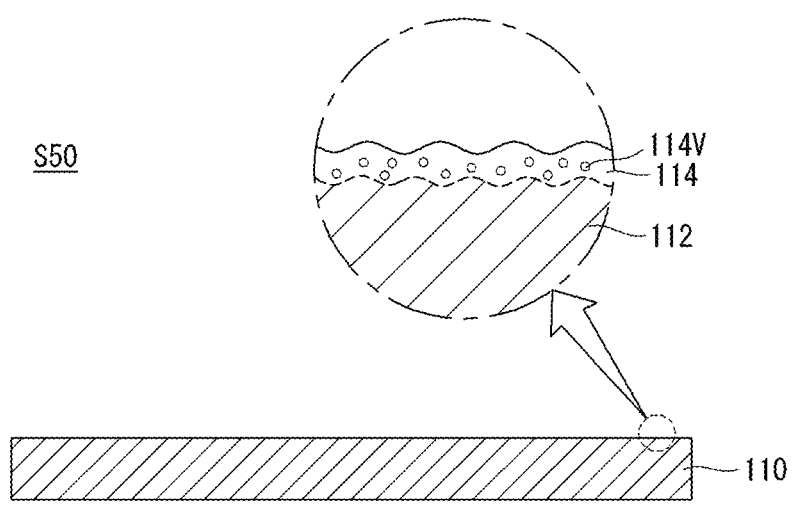

Next, as shown in FIG. 6D, in a glass tempering step S50, a non-tempered glass substrate constituting the first base member 112 is tempered or semi-tempered glass substrate by a heat tempering process through a heat treatment or annealing. In this instance, the ceramic frit 1134, the coloring material 1132, and the like included in the colored forming layer 113 are introduced and mixed into the tempered or semi-tempered glass substrate to match a phase equilibrium, and thus, the colored portion 114 constituting a part of the tempered or semi-tempered glass substrate is formed. In this instance, the colored forming layer 113 may have a specific gravity larger than that of the first base member 112 because of its high mass ratio. Then, the colored forming layer 113 is sticky and fused by a high temperature in the glass reinforcing step S50, and thus, a material of the colored forming layer 113 can be more easily incorporated or introduced into the first base member 112 formed of a glass substrate.

The glass tempering step S50 may be performed at a temperature being capable of tempering or semi-tempering the non-tempered glass substrate. For example, a heat treatment temperature of the glass tempering step S50 may be 500 to 800° C. (for example, 500 to 750° C., as an example, 650 to 750° C.). However, embodiments of the invention are not limited to the heat treatment temperature of the glass tempering step S50.

As an example, the non-tempered glass substrate constituting the first base member 112 may be semi-reinforced in the glass tempering step S50. Accordingly, the first base member 112 or the first cover member 110 may be formed of a semi-tempered glass substrate by a heat tempering process (that is, a heat-strengthened glass). According to this, a light transmittance of the first cover member 110 can be kept high. In this instance, the first cover member 110 formed of semi-tempered glass may have a surface compressive stress of 60 MPa or less (for example, 24 to 52 MPa). As an example, an edge stress of the first cover member 110 may be about 30 to 40 MPa. That is, the semi-tempered glass may be formed by annealing at a temperature slightly lower than a softening point and then gradually cooling. For reference, fully tempered glass may be formed by a heat treatment at a temperature higher than a softening point and then quenching, and may have a surface compressive stress of 70 to 200 MPa.

As described above, in the embodiment, a light transmittance of the colored portion 114 can be kept high by adjusting a heat treatment temperature, a cooling rate, and the like in the glass tempering step S50. In particular, by a heat treatment temperature within a predetermined range and a cooling rate below a certain level, the colored portion 114 may have an amorphous glass structure, so that the an average light transmittance with respect to a light in an infrared region can be maintained relatively high. This will be described in more detail later. In contrast to the above, if the heat treatment temperature is not maintained within a certain range and/or the cooling rate or pressure is too high, a phase change of the amorphous glass structure or an interfacial bond change between the glass substrate and the colored portion may be generated due to a chemical structure change of an oxide ceramic composition as the colored portion. Then, it is difficult that an average light transmittance with respect to a light in an infrared region may be the same as or higher than an average light transmittance with respect to a light in a visible light region. If the heat treatment temperature is lower than a certain level (for example, less than 650° C.), a possibility that the colored portion 114 is peeled off from the first base member 112 may be increased. If the heat treatment temperature exceeds a certain level (for example, exceeds 750° C.), the colored portion 114 may not have a desired color, or the light transmittance tendency may change, and thus the colored portion 114 may not have desirable properties.

Next, in a finishing step S60, the first cover member 110 on which the glass tempering step S50 has been performed is cleaned and dried. Then, a manufacturing process of the first cover member 110 having the colored portion 114 of an integrated structure with the first base member 112 is completed.

In this instance, an amount of sodium or potassium included in the ceramic material layer, the colored forming layer 113, or the colored portion 114 may be similar to or lower than an amount of sodium or potassium included in the first base member 112. Particularly, amounts of sodium and potassium included in the ceramic material layer, the colored forming layer 113, or the colored portion 114 may be lower than amounts of sodium and potassium included in the first base member 112, respectively. As an example, the ceramic material layer, the colored forming layer 113, or the colored portion 114 may include sodium and potassium in an amount of $10 \times 10^{18}$ atoms/cc or less, respectively. If the ceramic material layer, the colored forming layer 113, or the colored portion 114 includes sodium or potassium in an amount greater than $10 \times 10^{18}$ atoms/cc, a potential-induced degradation (PID) phenomenon may generate due to a leakage current and a reliability of the solar cell panel 100 may be deteriorated. Also, the ceramic material layer, the colored forming layer 113, or the colored portion 114 may not include lead and/or chrome (for example, a lead oxide and/or a chromium oxide), and thus, environmental problems can be avoided. For example, an amount of sodium, potassium, and lead included in the ceramic material layer, the colored forming layer 113, or the colored portion 114 may be measured or determined by secondary ion mass spectrometry (SIMS).

The first cover member 110 formed by the manufacturing process includes a first base member 112 formed of a tempered or semi-tempered glass substrate, and a colored portion 114 including a ceramic frit 1134 in the tempered or semi-tempered glass substrate or the like and formed of an integral portion constituting a part of the semi-tempered glass substrate. That is, the colored portion 114 is formed of a part of the tempered or semi-tempered glass substrate constituting the first base member 112, and includes a material (e.g., a ceramic oxide composition having an amorphous glass structure) other than the first base member 112. The colored portion 114 may be formed in such a manner that the ceramic frit 1134, the coloring material 1132 or the like is diffused and penetrated into an inside of the first base member 112 and is mixed with a material of the glass substrate constituting the first base member 112 in a tempering or semi-tempering process of the glass substrate. According to this, the colored portion 114 may be formed integrally with the first base member 112, and thus, a physical durability and a chemical durability can be excellent.

In the embodiment, the colored portion 114 is formed of an oxide ceramic composition having an amorphous glass structure as described above. For example, the colored portion 114 may be formed by including a plurality of metal compounds (for example, metal oxides) including a plurality of metals and a non-metal included in the ceramic frit 1134 and/or the coloring material 1132. The colored portion 114 may have oxygen polyhedron having a random network structure, a glass structure, a random network structure, or the like including a plurality of metals and oxygen. Whether the colored portion 114 is formed of an oxide ceramic composition or not may be determined by X-ray photoelectron spectroscopy (XPS) or the like.

The oxide ceramic composition having the amorphous glass structure may be formed by a heat treatment at a temperature lower than a temperature at which the generally-used or conventional oxide ceramic is formed. That is, the oxide ceramic composition having an amorphous glass structure may not include a crystalline portion or may only partially include a crystalline portion. In this instance, in the oxide ceramic composition having the amorphous glass structure, an amorphous portion may be included with an amount the same as or more than a crystalline portion, and in particular, the amorphous portion may be included more than the crystalline portion. For example, an oxide ceramic composition having an amorphous glass structure may have a crystallinity of 50% or less (more specifically, less than 50%, for example, 20% or less). The generally-used or conventional oxide ceramic means oxides of an ionic bond, a covalent bond, or a mixture thereof, which means an inorganic non-metal material manufactured at high temperature and high pressure. Most of portion of the generally-used or conventional oxide ceramic may be formed of a crystallized portion because the generally-used or conventional oxide ceramic is heat-treated at a high temperature of 850° C. or higher (for example, around 1400° C.) and at a high pressure.

The colored portion 114 may include a ceramic frit 1134 as a base material (for example, a material of the largest parts by weight, or a material having 50 parts by weight or more). The colored portion 114 may further optionally include a coloring material 1132, an additive, or the like. Since the resin 1136 may be volatilized during a heat treatment in the glass tempering step S50, the colored portion 114 may include or not include the resin 1136. A distinction between the ceramic frit 1134 and the coloring material 1132 of the colored portion 114 may not be clear even when the colored portion 114 includes the coloring material 1132. For example, a metal of a material included in the coloring material 1132 may be present in a form of a metal included in an oxygen polyhedron, a glass structure, or a random network structure constituting the ceramic frit 1134. The ceramic frit 1134 or the like included in the colored portion 114 may be discriminated by any of various component analysis methods (for example, scanning electron microscopy-energy dispersive spectroscopy (SEM-EDX) or the like).

The first cover member 110 according to the embodiment can realize a desired appearance by the colored portion 114. For example, an appearance and a light transmittance of the first cover member 110 can be adjusted by adjusting a color, a material, an area ratio, a thickness, etc. of the colored portion 114, or a material, a size, a concentration, a density, etc. of the ceramic frit 1134, coloring material 1132, or so on included in the colored portion 114. In the embodiment, the colored portion 114 has a lower light transmittance than the first base member 112, but can transmit a part of a solar light. Then, the solar light can also be transmitted through the colored portion 114, and thus, a light loss by the colored portion 114 can be prevented or minimized. For example, the colored portion 114 or the first cover member 110 having the colored portion 114 may have a light transmittance of 10% or more (for example, 10% to 95%, more specifically, 20% to 95%). However, embodiments of the invention are not limited thereto. Accordingly, a light transmittance may have various values depending on a color, a material, a forming area, or the like of the colored portion 114.

The colored portion 114 according to the embodiment may be formed of an oxide ceramic composition (particularly, an oxide ceramic composition having an amorphous glass structure) and has a specific light transmittance tendency according to wavelength, a void 114V, a surface roughness, or so on. Thus, a reduction in an output of the solar cell panel 100 can be prevented or minimized even if the light transmittance is lowered by the colored portion 114 to some degree. This will be described in detail with reference to FIGS. 7 to 10 together with FIG. 3.

Figure 7:
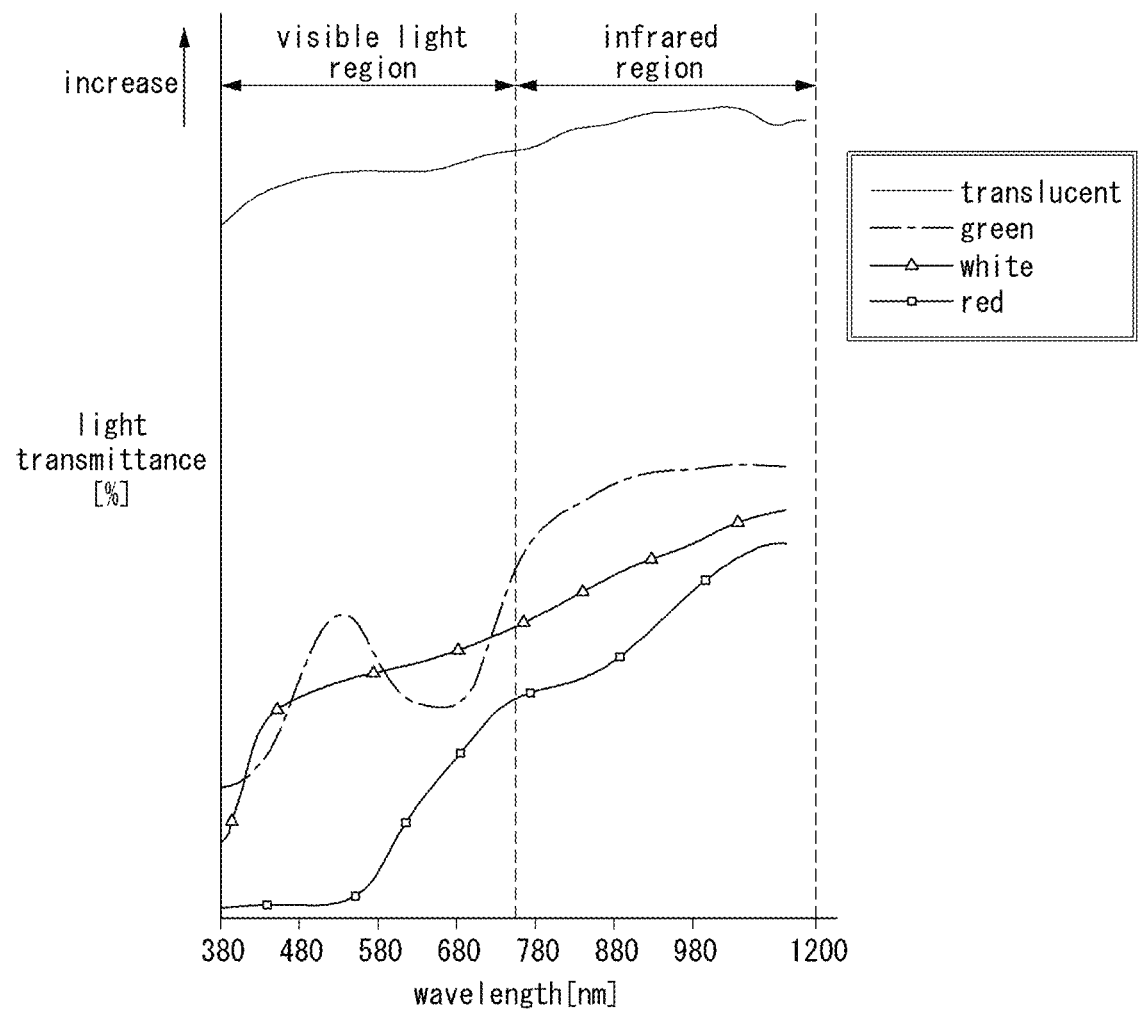
FIG. 7 is a graph showing a light transmittance of a colored portion of each color included in a solar cell panel according to an embodiment of the invention according to a wavelength.
Figure 8:
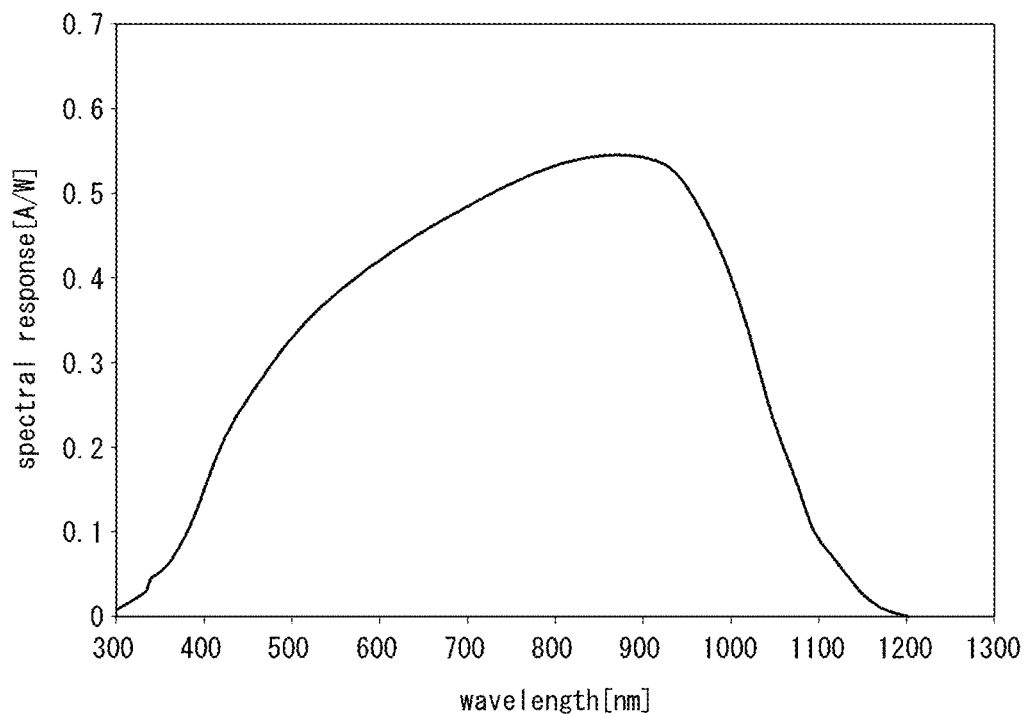
FIG. 8 is a graph showing a spectral response of a solar cell based on single-crystal silicon according to a wavelength.
Figure 9:
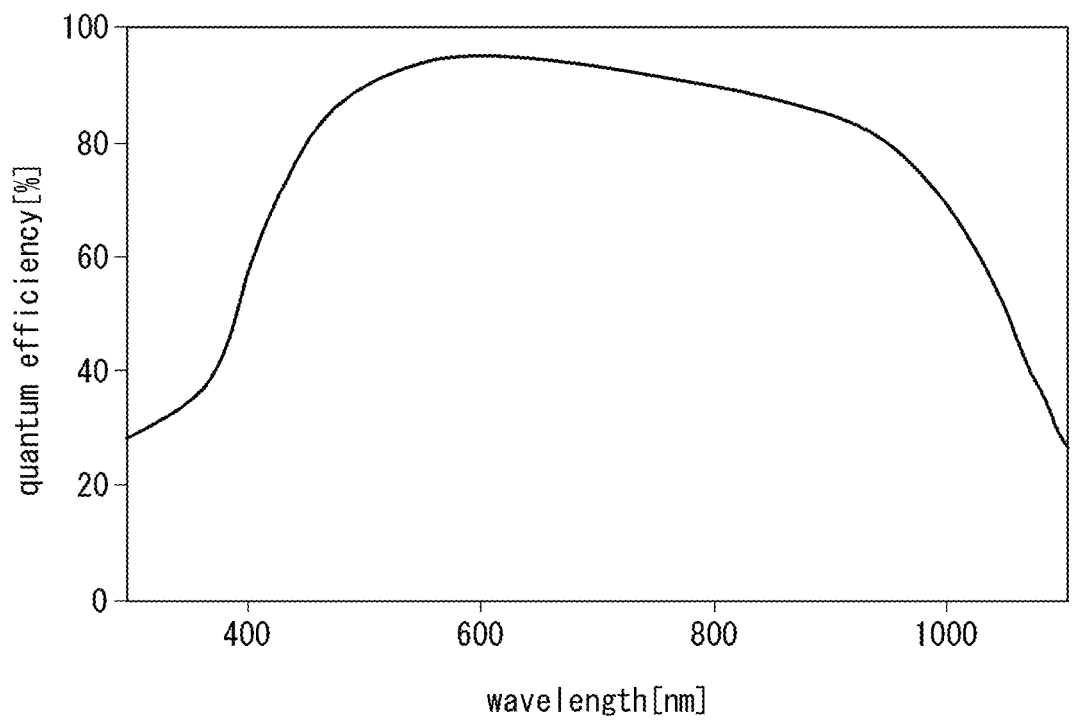
FIG. 9 is a graph showing a quantum efficiency of a solar cell based on single-crystal silicon according to a wavelength.
Figure 10:
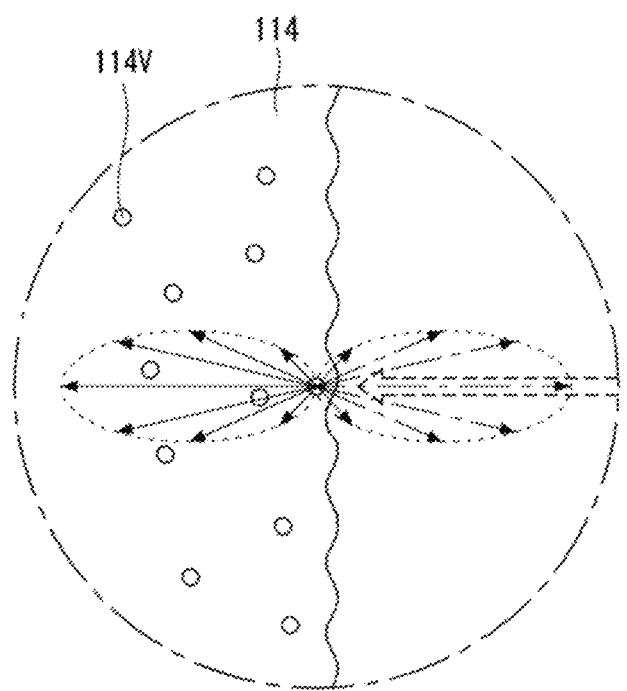
FIG. 10 is a view schematically showing a light diffusion in a colored portion of a first cover member included in the solar cell panel according to the embodiment of the invention.

FIG. 7 is a graph showing a light transmittance of a colored portion 114 (for example, a colored layer 1142) of each color included in the solar cell panel 100 according to the embodiment of the invention according to a wavelength. FIG. 8 is a graph showing a spectral response of a solar cell 150 based on single-crystal silicon according to a wavelength, and FIG. 9 is a graph showing a quantum efficiency of a solar cell 150 based on single-crystal silicon according to a wavelength. FIG. 10 is a view schematically showing a light diffusion in a colored portion 114 of a first cover member 110 included in the solar cell panel 110 according to the embodiment of the invention.

In the embodiment, as shown in FIG. 7, in the colored portion 114 formed of the oxide ceramic composition having an amorphous glass structure, a first average transmittance, which is an average light transmittance for a light in an infrared region, may be the same as or greater than a second average transmittance, which is an average transmittance for a light in a visible light region. In particular, in the colored portion 114 formed of the oxide ceramic composition having an amorphous glass structure, the first average transmittance may be larger than the second average transmittance. In the colored portion 114 formed of an oxide ceramic composition having an amorphous glass structure, a third average transmittance, which is an average light transmittance for a light in a ultraviolet region may be smaller than each of the first average transmittance and the second average transmittance, which are the average light transmittance for the light in the infrared light region and the average light transmittance for the light in the visible light region, respectively. In this instance, a light in a ultraviolet region may be defined as a light having a wavelength of 100 nm to 380 nm, a light in a visible light region may be defined as a light having a wavelength of 380 nm to 760 nm, and a light in an infrared region may be defined as a light having a wavelength of 760 nm to 1200 nm. The average light transmittance may be defined as an average of normalized light transmittance so as not to reflect a light transmittance of the first base member 112.

As shown in FIG. 7, it can be seen that the second average transmittance is larger than the third average transmittance and the first average transmittance is the same as or larger than the second average transmittance although there is a difference depending on the color. This tendency can be realized by a temperature, a cooling rate, or the like of a heat treatment in the glass tempering step S50.

When the first average transmittance is the same as or greater than the second average transmittance as described above, even if the colored portion 114 is provided, an amount of a light passing through the first cover member 110 and reaching the solar cell 150 in the infrared region may be the same as or larger than an amount of a light passing through the first cover member 110 and reaching the solar cell 150 in the visible light region. Accordingly, even when a light transmittance is lowered by the colored portion 114 to some degree, the light in the infrared region reaches the solar cell 150 and can be effectively used. Accordingly, even if the light transmittance is lowered by the colored portion 114 to some degree, a reduction in photoelectric conversion efficiency of the solar cell 150 or an output of the solar cell panel 100 can be prevented or minimized.

As described above, the first and second average transmittances may be larger than the third average transmittance, respectively. In this instance, the colored portion 114 includes the ceramic fit 1134, the coloring material 1132, an additive, or the like and thus the colored portion 114 has a refractive index higher than that of the first base member 112 formed of a glass substrate. Then, the colored portion 114 may have a relatively low third average transmittance because the colored portion 114 has a higher extinction coefficient than the first base member 112 formed of a glass substrate by the material and has the refractive index of the colored portion 114. The light in the ultraviolet region does not contribute much to photoelectric conversion efficiency of the solar cell 150 and an output of the solar cell panel 100, and may induce a deformation, a property change, or the like of the solar cell 150 and the sealing member 130 due to high photon energy. In the embodiment, the colored portion 114 scatters, blocks, or absorbs light in the ultraviolet region, thereby lowering a light transmittance of a light in the ultraviolet region. Accordingly, the photoelectric conversion efficiency of the solar cell 150 and the output of the solar cell panel 100 cannot be affected greatly while the deformation, the property change, or the like of the solar cell 150 or the sealing member 130 that may be caused by the light in the ultraviolet region can be minimized.

For example, in the embodiment, the colored portion 114 may have a first average transmittance greater than the second average transmittance by 2% or more. Alternatively, a first difference between the first average transmittance and the second average transmittance may be greater than a second difference between the second average transmittance and the third average transmittance. In this case, the light in the infrared region can be more effectively used in the solar cell panel 100. The first to third average transmittances may be measured by any of various methods. For example, a method being able to measure both of a transmittance of a vertical light (a normal transmittance) and a diffused transmittance of the scattered light (a diffused transmittance) may be used. For example, at least one of the first to third average transmittances may be measured by a standard measurement method such as ISO 9050:2003, BS EN 14500:2008, or the like.

Referring to FIG. 8, it can be seen that a spectral response (that is, a short circuit current density (Isc) or an output generated at a specific wavelength of a light) of a solar cell 150 based on single-crystal silicon is high in a light in an infrared region. Referring to FIG. 9, it can be seen that a quantum efficiency of the solar cell 150 based on single-crystal silicon is high in a light in an infrared region. In the embodiment, by improving an average light transmittance of a light in an infrared region having a high spectral response and a high quantum efficiency, the light in the infrared region can be effectively used even when a light transmittance is lowered to some degree by the colored portion 114 for realizing a specific color, feeling, texture, or so on. Accordingly, even when the colored portion 114 is formed, a photoelectric conversion efficiency of the solar cell 150 or an output of the solar cell panel 100 can be maintained at a high value. Since a spectral response and a quantum efficiency of a light in a ultraviolet region are very low, even when the third average transmittance of the colored portion 114 is low, a photoelectric conversion efficiency of the solar cell 150 or an output of the solar cell panel 100 may be not affected by the low third average transmittance.

In the embodiment, the colored portion 114 may include a void 114V to be porous. The resin 1136 provided in the ceramic material layer or the colored forming layer 113 volatilizes in a heat treatment process (for example, the glass tempering step S50) for forming the colored portion 114, and a portion where the resin 136 volatilizes forms the void 114V.

As an example, a void 114V having a size of 0.1 um or more may be provided. It is possible to maximize an effect of the void 114V in the above size of the void 114V. The size of the void 114V may vary depending on a method of forming the colored portion 114. For example, the colored portion 114 formed by inkjet printing may be provided with voids 114V having a size of 0.1 um or more, and the colored portion 114 formed by screen printing may be provided with voids 114V having a size of 0.5 um or more. A maximum size of the void 114V may be the same as a thickness of the colored portion 114. For example, the void 114V in the colored portion 114 may have a size of 0.1 to 15 um. More specifically, the void 114V in the colored portion 114 formed by inkjet printing may have a size of 0.1 to 7 um, and the void 114V in the colored portion 114 formed by screen printing may have a size of 0.5 um to 15 um. For example, a total area ratio of the voids 114V in the colored portion 114 in a plan view may be 4% or more. The total area ratio of the voids 114V in the colored portion 114 formed by inkjet printing is 4% or more and the total area ratio of the voids 114V in the colored portion 114 formed by screen printing is 7.5% or more.

In the embodiment, a size (for example, an average size) of the voids 114V in the background layer 1140 may be smaller than a size (for example, an average size) of the voids 114V in the colored layer 1142, or a total volume of the voids 114V in the background layer 1140 may be less than a total volume of the voids 114V in the colored layer 1142. This is because the resin 1136 included in the background layer 1140 positioned adjacent to the first base member 112 is less volatiles than the resin 1136 included in the colored layer 1142 during the glass tempering step ST50. On the other hand, when a colored layer 1142 is adjacent to a first base member 112 and a background layer 1140 is positioned on the colored layer 1142, a size (for example, an average size) of the voids 114V in the colored layer 1142 may be smaller than a size (for example, an average size) of the voids 114V in the background layer 1140, or a total volume of the voids 114V in the colored layer 1142 may be less than a total volume of the voids 114V in the background layer 1140. That is, a size (for example, an average size) of voids 114V in a first layer adjacent to the first base member 110 may be smaller than a size (for example, an average size) of voids 114V in a second layer positioned on the first layer, or a total volume of the voids 114V in the first layer may be less than a total volume of the voids 114V in the second layer. However, embodiments of the invention are not limited thereto.

A size, an area ratio, or so on of the voids 114V may be varied depending on a material of the ceramic material layer, the colored forming layer 113, or the colored portion 114 (or the coloring material 1132, the ceramic frit 1134, the resin 1136, or the like included therein), or a manufacturing method, a process condition, or the like of the ceramic material layer, the colored forming layer 113, the colored portion 114. When the voids 114V are positioned in the colored portion 114, a light incident to the solar cell panel 100 is dispersed widely and diffused at the void 114V as shown in FIG. 10. More specifically, when the colored portion 114 has the voids 114V, a normal transmittance and a diffused transmittance coexist, resulting in a hemispherical transmittance. In this instance, as shown by a solid line in FIG. 10, voids 114V of the colored portion 114 scatters light incident to the solar cell panel 100 so that a light incident to the solar cell panel 100 has a form of a hemispherical transmittance. Then, a part of the light that may be lost toward an area between the solar cells 150 is directed toward the solar cell 150 and thus is used at the solar cell 150, or a part of the light may be reused by a scattering at an interface between the colored portion 114 and the first base member 112. Accordingly, even when the colored portion 114 is provided, a photoelectric conversion efficiency of the solar cell 150 and an output of the solar cell panel 100 can be kept high by maximizing an amount of light used for photoelectric conversion. For example, at least a part of the colored portion 114 may be positioned at a portion corresponding to an area between the solar cells 150. As shown one-dot chain line in FIG. 10, voids 114V of the colored portion 114 scatters light incident to the solar cell panel 100 so that a light has a form of a hemispherical transmittance toward an outside of the solar cell panel 100, thereby improving an anti-glare property. On the other hand, if the colored portion 114 does not have the void 114V, a diffused transmission does not occur sufficiently as compared with the case where the colored portion 114 has the void 114V, and the colored portion 114 may have a relatively low light transmittance.

In the embodiment, a surface roughness of a boundary portion between the first base member 112 and the colored portion 114 (that is, an interface of the colored portion 114) at a portion where the colored portion 114 is formed may be greater than a surface roughness at a portion where the colored portion 114 is not formed. That is, as shown in an expanded circle in FIG. 3, a surface roughness of a boundary portion between one surface of the first base member 112 and the colored portion 114 may be greater than a surface roughness at the other surface or a side surface of the first base member 112 or a surface roughness of the one surface at a portion where the colored portion 114 is not formed. The surface roughness may be relatively large at the interface portion with the first base member 112 because the ceramic frit 1134 and the coloring material 1132 are diffused and mixed into the first base member 112 and a material moves for a phase equilibrium when the colored portion 114 is formed.

In FIG. 3, for example, it is shown that a light diffusion portion LD is formed at the other side where the colored portion 114 is not formed. The light diffusing portion LD can diffuse a light to maximally prevent the solar cell 150 and the like from being recognized and improve a uniformity of a color or the like by the colored portion 114. For example, when the light diffusion portion LD is formed to be in contact with the sealing member 130, an adhesion area with the sealing member 130 can be increased to improve the adhesion. For example, the light diffusion portion LD may have a size of 10 to 500 um, and may have any of various shapes such as a rounded shape (for example, a shape corresponding to a part of a spherical shape), an angular shape, a pyramid shape, or the like. The light diffusion portion LD may have a protruding shape of en embossing shape and a concave shape with an engraving shape.

In this instance, a size of the light diffusion portion LD may be the same as or larger than (for example, larger than) a surface roughness of the boundary portion where the colored portion 114 is formed. In this instance, the size of the light diffusion portion LD may mean a distance or a length between the uppermost end and the lowermost end of the light diffusion portion LD. Thus, a diffusion effect by the light diffusion portion LD can be improved. The surface roughness of the boundary portion where the colored portion 114 is formed may be the same as or larger than (for example, larger than) a surface roughness of the light diffusion portion LD. In this instance, the surface roughness of the light diffusion portion LD may mean a surface roughness at an outer surface constituting a shape of the light diffusion portion LD. The outer surface of the light diffusion portion LD may have a relatively small surface roughness because the light diffusion portion LD is formed through a specific processing step so as to have a constant shape.

Due to the high surface roughness at the interface of the colored portion 114, the colored portion 114 can effectively scatter a light. That is, when the colored portion 114 has both of a high surface roughness and voids 114V, the scattering of light can be effectively induced. Particularly, when the colored portion 114 is positioned at a portion corresponding to a space between the solar cells 150 (that is, an inactive area NA), the light due to scattering in the colored portion 114 is directed to the solar cell 150 and thus can be used for photoelectric conversion. Accordingly, a photoelectric conversion efficiency of the solar cell 150 and an output of the solar cell panel 100 can be high.

For example, in the embodiment, each surface roughness of interface surfaces and an outer surface of the first base member 112 and a plurality of layers constituting the colored portion 114 (for example, an interface surface between the first base member 112 and the background layer 1140, an interface surface between the background layer 1140 and the colored layer 1142, and an outer surface of the colored portion 114) may be greater than a surface roughness of the other portion of the first base member 112. According to this, a plurality of interface surfaces having a surface roughness of a certain level or more can be provided to more effectively induce light scattering. However, embodiments of the invention are not limited thereto, and a surface roughness of a boundary surface between the background layer 1140 and the colored layer 1142, which constitute the colored portion 114, and/or an outer surface of the colored portion 114 may be the same as or similar to that of the other portion.

The colored portion 114 may have a refractive index (for example, a refractive index of 1.48 or more) larger than that of the first base member 112 or the sealing member 130. The colored portion 114 (or the colored layer 1142 or the background layer 1140 included therein) may have a thickness of 1 um or more (e.g., 1 um to 15 um). The thickness of the colored portion 114 may vary depending on a manufacturing process of the colored portion 114. For example, when the colored portion 114 (or the colored layer 1142 or the background layer 1140 included therein) is formed by screen printing, the colored portion 114 may have a thickness of 1 to 15 μm. When the colored portion 114 (or the colored layer 1142 or the background layer 1140 included therein) is formed by inkjet printing, the colored portion 114 may have a thickness of 1 um to 7 um. If the thickness of the colored portion 114 is less than 1 μm, it may be difficult to realize a desired appearance, and a density of the coloring material 1132 may be decreased when the colored portion 114 includes the coloring material 1132 and it may be difficult to exhibit a desired color. If the thickness of the colored portion 114 is more than 15 μm (for example, 7 μm), a light transmittance may be deteriorated as a whole and peeling or cracking of the colored portion 114 may occur. For example, in order to simplify a manufacturing process of the colored portion 114 and to reduce the material cost, a thickness of the colored portion 114 (or the colored layer 1142 or the background layer 1140 included therein) may be 1 um to 2 um as an example, but embodiments of the invention are not limited thereto. In addition, a thickness of the colored portion 114 may be adjusted according to a color. For example, when the colored portion 114 has a white color having a relatively low light transmittance, a thickness of the colored portion 114 may be smaller than that of the colored portion 114 having other colors.

On the other hand, in the convention art, a layer formed on the first cover member 110 has a low light transmittance in an infrared region, and thus, an amount of a light reaching a solar cell in an infrared region is smaller than an amount of a light reaching a solar cell in a visible light region. Thus, it has been difficult to effectively utilize the light. For example, an anti-reflection layer for preventing reflection has the largest light transmittance at a short wavelength of about 600 nm, which has the strongest solar light intensity, to prevent a reflection of the light of the short wavelength. In the conventional art, even if a layer (for example, an anti-reflection layer) provided on the first cover member 110 is formed of a material the same as or similar to that of the colored portion 114, an average light transmittance for a light in an infrared region is smaller than an average light transmittance for a light in a visible light region because the layer does not have a ceramic structure. Also, the anti-reflection layer has a refractive index of about 1.3 smaller than that of the first base member 112 and the sealing member 130 and has a thickness of 500 nm or less (e.g., about 200 nm or less). Accordingly, properties of the anti-reflection layer are different from those of the colored portion 114 in the embodiment, and it is difficult to effectively utilize the light in the infrared region by the anti-reflection layer or so on. Further, in most cases, since the layer (for example, the anti-reflection layer) provided on the first cover member 110 is formed by being laminated or deposited on the first cover member 112, a surface roughness at an interface of the layer (for example, the anti-reflection layer) does not differ from that of the other portions.

In the embodiment, the colored portion 114 is formed to correspond to a portion in a thickness direction on one surface of the first base member 112. More specifically, a portion of the colored portion 114 is embedded in an interior of the first base member 112 and the other portion of the colored portion 114 has a shape protruding from a substrate surface BS of the first base member 112 where the colored portion 114 is not formed. An outer surface of the colored portion 114 may have a rounded shape, or may have a surface roughness larger than that of other portions. However, embodiments of the invention are not limited thereto, and the colored portion 114 may have a different shape stated in the above. For example, the colored portion 114 may be formed to be flat to have a uniform thickness. Various other variations are possible.

In FIG. 4, it is exemplified that the colored portion 114 (or the colored layer 1140, the same hereinafter) is partially formed only at a part of the first cover member 110 to minimize a reduction in a light transmittance of the colored portion 114. Also, it is exemplified that a plurality of colored portions 114 form one cover area CA. In this instance, the cover area CA refers to an area recognized to have the same color, image, pattern, feeling, texture, or the like so as to realize a certain color, image, pattern, feeling, texture, or the like. For example, the cover area CA may be a colored area having a certain color.

In FIG. 4, it is exemplified that the colored portion 114 (for example, the colored layer 1142) constituting the cover area CA has a dot shape having a square shape, and a portion where the dotted colored portions 114 are not positioned in the colored area CA is connected as a whole to form a light transmitting portion LTA. However, embodiments are not limited thereto. The colored portion 114 may have a circular shape, an elliptical shape, a polygonal shape (a triangular shape, a rectangular shape, etc.), an irregular shape, or a combination thereof. As another example, a plurality of colored portions 114 may be elongated in one direction so as to have a straight shape so that the plurality of colored portions 114 may form a stripe shape. Then, a light transmitting portion LTA parallel to the plurality of colored portions 114 is positioned between the plurality of colored portions 114, and the colored portions 114 and the light transmitting portions LTA are alternatively arranged in a direction crossing the one direction. As other example, a colored portion 114 may have a checkered pattern including first portions extending in a first direction and second portions extending in a second direction crossing the first direction. Then, a portion having a dot shape surrounded by the first portions and the second portions may constitute a light transmitting portion LTA. In addition, the colored portion 114 may have any of various plane shapes.

In the embodiment, when the solar cell panel 100 is viewed from a position at a certain distance or more (for example, 1 m or more) with a naked eye, the solar cell panel 100 entirely has a uniform color, image, pattern, feelings, texture, or the like by the first cover member 110. For example, an output of the solar cell panel 100 may be not reduced greatly while an appearance of a building 1 (see FIG. 1) can be enhanced when the solar cell panel 100 is viewed from a position at a distance sufficient to view an exterior of the building 1.

For example, the colored portion 114 (for example, the colored layer 1142) may have a width or a size of 0.2 to 10 mm, and a ratio of a total area of the colored portions 114 (for example, the colored layer 1142) to a total area of the colored area CA may be 0.05 to 0.99 (more specifically, 0.2 to 0.8). When the plurality of colored portions 114 are viewed at a certain distance (for example, 1 m) in this range, they can be recognized as one color or as one portion. Further, the light can be sufficiently incident through the light transmitting portion LTA, and sufficient power generation can be achieved. In this instance, the light transmitting portion LTA may be positioned between the colored portions 114 or may form a part of an inner portion of the colored portion 114. However, embodiments of the invention are not limited thereto. For example, the cover area CA does not have the light transmitting portion LTA and the ratio of the total area of the colored portion 114 to the total area of the cover area CA may be 1. According to this, a glare phenomenon can be effectively prevented.

Alternatively, when the plurality of colored portions 114 or the plurality of colored layers 1142 are positioned at a certain distance from each other, the plurality of colored portions 114 or the plurality of colored layers 1142 can be recognized as one. For example, when the plurality of colored portions 114 or the plurality of colored layers 1142 are formed in a range of 1 to 100 dpi (dots per inch), the plurality of colored portions 114 or the plurality of colored layers 1142 are recognized as one to constitute the desired shape, image, pattern, or the like.

However, embodiments of the invention are not limited thereto. Therefore, the colored portion 114 (for example, each of the colored layer 1142 and the background layer 1140 included therein) may be formed at an entire portion of the first cover member 110. The effect of preventing a glare phenomenon by the colored portion 114 can be realized in the entire portion. Alternatively, the background layer 1140 may be formed at an entire portion of the first cover member 110, and the colored layer 1142 may be partially formed. Accordingly, the background layer 1140 is formed at the entire portion while reducing a formation area of the colored layer 1142, and a light scattering effect and an anti-glare effect by the background layer 1140 can be realized in the entire portion. In this instance, the colored layer 1142 and the background layer 1140 corresponding to a portion where the colored layer 1142 is positioned may be regarded as the colored portions 114, respectively. Alternatively, at least one of colored portions 114 may include portions having two or more colors. Other variations are possible.

In FIG. 3, it is exemplified that the background layer 1140 and the colored layer 1142 constituting the colored portion 114 are completely overlapped with each other with the same area. However, embodiments of the invention are not limited thereto. This will be described later in more detail with reference to FIGS. 11 to 13 later.

In the embodiment, the second cover member 120 may be formed of a colored glass substrate having the cover portion 124. In the embodiment, the cover portion 124 may be a portion that realizes a certain color so that the solar cell 150, the interconnectors 142 and 145, etc. are not recognized from the outside. Unlike the colored portion 114, the cover portion 124 is positioned on the back surface of the solar cell panel 100 having a building integrated structure and does not require light diffusion, scattering, or the like, and thus may have a specific color.

The second cover member 120 or the cover portion 124 may have a color so that a color difference ($\Delta E^*ab$) between the solar cell 150 (particularly, the anti-reflection layer 152 of the solar cell 150) and the second cover member 120 at International Commission on Illumination (CIE) Lab (that is, CIE $L^*a^*b^*$) color coordinates and D65 standard light source (noon solar light source) may be 11 or less. When the color difference ($\Delta E^*ab$) is 11 or less, the solar cell 150, the interconnectors 142 and 145 and the like can be prevented from being recognized from the outside at a certain distance or more. In this instance, at International Commission on Illumination (CIE) Lab (that is, CIE $L^*a^*b^*$) color coordinates and D65 standard light source, a luminance ($L^*$) of the second cover member 120 or the cover portion 124 may be 50 or less and thus may have a relatively dark color. Thus, the solar cell 150, the interconnectors 142 and 145 and the like can be prevented from being effectively recognized from the outside. However, embodiments of the invention are not limited thereto. As another embodiment, at International Commission on Illumination (CIE) Lab (that is, CIE $L^*a^*b^*$) color coordinates and D65 standard light source, a luminance ($L^*$) of the second cover member 120 or the cover portion 124 may be greater than 50 and thus may have a relatively bright color.

In this instance, a color of the cover portion 124 may be the same as or different from a color of the colored portion 114. More particular, the cover portion 124 may be not transparent, translucent, or the like, and may have an achromatic color, an opaque color except for white, or the same color as the solar cell 150. The cover portion 124 may have an achromatic color other than white, an opaque color, or a color of the same series as that of the solar cell 150. For example, a color of the cover portion 124 may be black, gray, blue, green, brown, the color of the same series as that of the solar cell 150 (more particularly, the anti-reflection layer 152 of the solar cell 150), or a mixed color thereof. Since white has a high brightness, it may be difficult to form the cover portion 124 by using it. For example, when the cover portion 124 is formed of the color of the same series as that of the solar cell 150, a color uniformity is achieved and the solar cell panel 100 has uniformity of color as a whole, thereby further improving an aesthetic property. However, embodiments are not limited thereto. Any of various colors other than the above-mentioned color, which has brightness lower than that of the colored portion 114 or a light transmittance lower than that of the first base member 112 and/or the second base member 122, may be used.

As described above, when the second cover member 120 has a certain color to prevent the solar cell 150 from being recognized, a color of the sealing member 130 may not be changed or the sealing member 130 may be not colored. If the sealing member 130 includes a coloring material (for example, carbon black) for changing the color, an insulating property of the sealing member 130 may be undesirably deteriorated. However, embodiments of the invention are not limited thereto, and the sealing member 130 (for example, the second sealing member 132) may be colored with a black, blue, or blue-black color.

As an example, in the embodiment, the cover portion 124 may be formed of an oxide ceramic composition. Thus, the first and second cover members 110 and 120 may be formed by the same or similar manufacturing process, thereby simplifying a manufacturing process. In this instance, a description of the oxide ceramic composition constituting the colored portion 114 and the first cover member 110 described above may be applied to the oxide ceramic composition constituting the cover portion 124 and the second cover member 120 as it is. However, as described above, the cover portion 124 may be formed of a single colored layer without a background layer, and a coating step for coating a ceramic material layer and a drying step of drying the same may be performed only once. However, embodiments of the invention are not limited thereto, and a plurality of coating steps and/or drying steps for the cover portion 124 may be performed in consideration of a desired thickness and the like.

Further, in the embodiment, the cover portion 124 may be formed of a material other than an oxide ceramic composition. For example, the cover portion 124 may include a plurality of cover layers stacked to realize a certain color, and the plurality of cover layers may includes a dielectric layer, an insulating layer, or a semiconductor layer.

In one example, the cover portion 124 includes a silicon layer including silicon constituting a photoelectric conversion portion of the solar cell 150, and dielectric layer or an insulating layer disposed on the silicon layer and having the same material and a stacked structure as the anti-reflection layer 152. Then, the cover portion 124 may have the same or similar color as the solar cell 150, and thus, the same or similar color as the solar cell 150 can be easily realized. Accordingly, it is possible to effectively prevent the solar cell 150 and the interconnectors 142 and 145 from being recognized by a simple structure.

As another example, the cover portion 124 may include a plurality of cover layers, each being formed of a metal compound (e.g., a metal oxide or a metal oxynitride). For example, the cover layer may have a structure in which a plurality of insulating layers, each formed of an oxide or a oxynitride including silicon, titanium, aluminum, zirconium, zinc, antimony, and copper, are stacked. In the case where the plurality of cover layers are formed of oxide or oxynitride, the cover portion 124 may further include a layer including a silicon nitride and/or a layer including a silicon carbonitride inside or outside a plurality of cover layers to prevent problems caused by ultraviolet rays, moisture, or the like. For example, when the cover portion 124 includes a first cover layer formed of a silicon oxide, a second cover layer positioned thereon and formed of a silicon nitride, and a third cover layer positioned thereon and formed of a silicon carbonitride, the cover portion 124 may have a blue color. Alternatively, when the cover portion 124 may include a first cover layer formed of zirconium oxide, a second cover layer positioned thereon and formed of a silicon oxide, a third cover layer positioned thereon and formed of a zirconium oxide, the cover portion 124 may have a green color.

According to this, the cover portion 124 can be formed by a simple manufacturing process such as vapor deposition, and the second cover member 120 having a desired color can be manufactured by a simple manufacturing process.

In the above, it is exemplified that the second cover member 120 includes the second base member 122 formed of a glass substrate and the cover portion 124, but embodiments of the invention are not limited thereto. For example, the cover portion 124 may be formed of a cover layer (e.g., a layer having a black, blue or blue-black color) or a metal layer (e.g., a silver or aluminum layer coated to have a black, blue, or blue-black color) and may be deposited or attached to a second base member 122 formed of a glass substrate. Alternatively, the second cover member 120 may be formed of a single member without the second base member 122 and the cover portion 124. For example, the second cover member 120 may be formed of a metal plate (for example, a steel plate) or a glass substrate or the like having a black, blue, or blue-black color. Besides, the second cover member 120 or the second base member 122 may be formed of a resin (for example, polycarbonate (PC), poly ethylene terephthalate (PET), ethylene tetrafluoroethylene (ETFE), polytetrafluoroethylene (PTFE), etc.), fiber reinforced plastic, or the like. A separate cover portion 124 may be formed on the second base member 122 formed of a sheet or the like, or a pigment may be included in the second base member 122 to have a certain color. The second base member 122 formed of a sheet or the like may be formed of a single layer or a plurality of layers.

In the above description, it is exemplified that the second cover member 120 is formed of a colored member having a certain color. However, embodiments of the invention are not limited thereto, and the second cover member 120 may have any of various properties of translucent, non-transmissive, or reflective properties. Various other variations are possible.

In FIG. 3, it is exemplified that the cover portion 124 is positioned on an outer surface of the second cover member 120. The cover portion 124 may be positioned on the outer surface of the second cover member 120 and may be positioned adjacent to a back surface of the solar cell panel 100. However, embodiments of the invention are not limited thereto. Thus, the cover portion 124 may be positioned at least one of an inner surface and an outer surface of the second cover member 120. As described above, the light diffusing portion LD where protrusions, indentations, irregularities, texturing, or the like is formed may be formed at the other surface where the colored portion 114 or the cover portion 124 is not formed. However, the light diffusing portion LD is not essential, and the other surface on which the colored portion 114 or the cover portion 124 is not formed may be formed of a flat plane without the light diffusion portion LD. Various other variations are possible.

In the embodiment, the cover portion 124 is formed of a single color at an entire area of the second cover member 120, and one cover portion 124 forms one cover area CA. However, embodiments of the invention are not limited thereto, and the cover portion 124 may be partially formed only at a part of the second cover member 110. These examples will be described later in detail with reference to FIGS. 25 and 26. Other variations are possible.

According to the embodiment, the colored portion 114 having a first average transmittance, which is an average light transmittance in an infrared region, is the same as or larger than a second average transmittance, which is an average light transmittance in a visible light region, is included in the first cover member 110, and thus, an output of the solar cell panel 100 can be maintained at a high level while improving an appearance and an aesthetic property of the solar cell panel 100. The colored portion 114 can be formed of an oxide ceramic composition to effectively prevent a glare phenomenon that may occur when the first cover member 110 includes a glass substrate. Even when the solar cell panel 100 is viewed from a lateral side, a color change or the colored portion 114 is not recognized and the desired color, image, pattern, feeling, texture, etc. can be maintained. The second cover member 120 is colored by the cover portion 124 to have a color for preventing the solar cell 150 and the interconnectors 142 and 145 from being recognized, thereby further improving an appearance of the solar cell panel 100.

On the other hand, if a colored portion separately formed on the first or second base member 112 or 122 is not integrated with the first or second base member 112 or 122, a color of the colored portion may be recognized differently from the other member of the solar cell panel 100 when viewed from the lateral side or in a bright circumstance, and an aesthetic property may be deteriorated. In addition, the conventional colored glass has a very low light transmittance and may greatly reduce an output of the solar cell panel 100 when it is applied to the first cover member 110 of the solar cell panel 100 or the like.

Particularly, in the embodiment, the colored portion 114 includes the background layer 1140 together with the colored layer 1142 to prevent undesirable darkening of a portion where the colored layer 1142 is positioned, or to realize a color of the colored layer 1142 more clearly. In addition, by a light scattering, a uniform light transmittance in the entire portion of the solar cell panel 100 can be achieved, and an effect of preventing a glare phenomenon can be further improved. Thus, an appearance and an output of the solar cell panel 100 can be effectively improved.

In FIG. 3, it is exemplified that the background layer 1140 and the colored layer 1142 are formed with a clear boundary. The background layer 1140 and the colored layer 1142 may be distinguished by a color difference or the like. The background layer 1140 and the colored layer 1142 may have different shapes and structures in a shape analysis due to a density difference, which may be identified by a scanning electron microscope (SEM) photograph. Alternatively, a difference between materials of the background layer 1140 and the colored layer 1142 may be determined by energy dispersive X-ray spectroscopy (EDS). However, embodiments of the invention are not limited thereto, and the background layer 1140 and the colored layer 1142 may not have a definite boundary in a final structure. However, even in this case, whether or not the background layer 1140 is provided may be determined by a color difference, a density difference, materials, etc. of the background layer 1140 and the adhesion layer 1142.

Hereinafter, a solar cell panel according to another embodiment of the invention will be described in detail. Detailed descriptions will be omitted for the same or extremely similar parts as those described above, and only different parts will be described in detail. It is also within the scope of the invention to combine the above-described embodiments or variations thereof with the following embodiments or modifications thereof.

Figure 11:
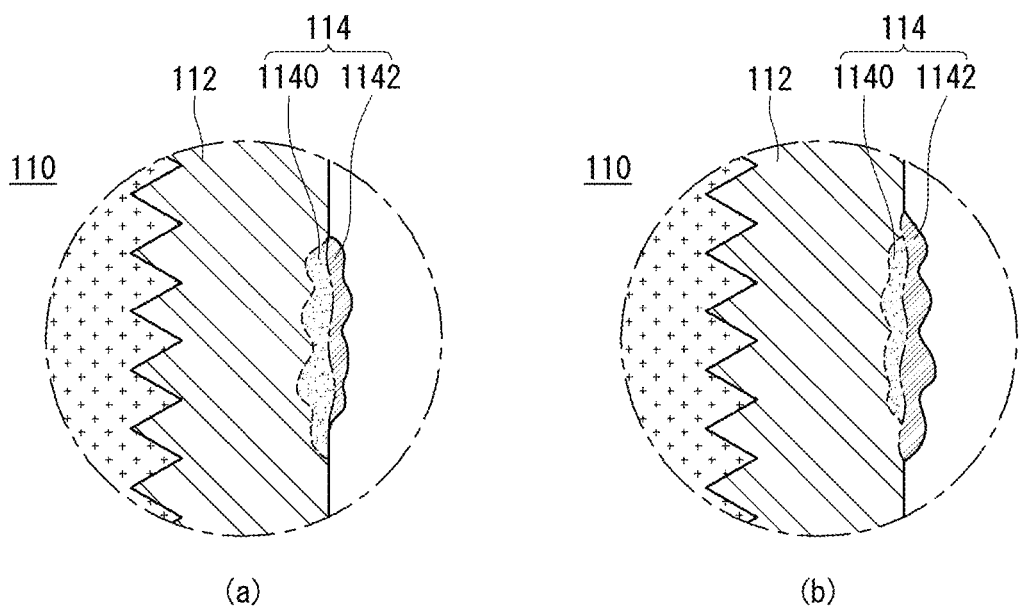
FIG. 11 is a partial cross-sectional view schematically showing various examples of a first cover member included in a solar cell panel according to a modified embodiment of the invention.

FIG. 11 is a partial cross-sectional view schematically showing various examples of a first cover member included in a solar cell panel according to a modified embodiment of the invention. In FIG, 11, a cross-sectional shape of a first base member 112, a background layer 1140, and a colored layer 1142 are schematically shown, and thus, voids 114V or so on is not shown and a shape of an interfacial surface or an outer surface are schematically shown.

As shown in FIG. 11, in the modified embodiment, a background layer 1140 and a colored layer 1142 are stacked to each other so as to have a portion overlapping each other, and may have different areas. For example, as shown in FIG. 11(a), an area of a background layer 1140 may be larger than an area of a colored layer 1142, and thus, an entire area of the colored layer 1142 may be positioned on a partial area of the background layer 1140. According to this, a reduction in a light transmittance by the colored layer 1142 can be minimized while sufficiently improving a brightness, a clear realization of a color, a light scattering, a light diffusion and so on by the background layer 1140. As shown in FIG. 11(b), an area of a colored layer 1142 may be larger than that of a background layer 1140 so that the colored layer 1142 is formed to cover an entire outer surface and a side of the background layer 1140 as a whole. Then, a color can be clearly realized by the colored layer 1142.

Figure 12:
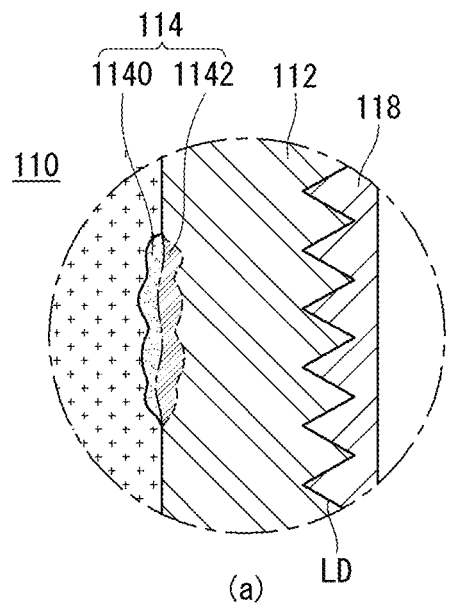
FIG. 12 is a partial cross-sectional view schematically showing various examples of a first cover member included in a solar cell panel according to another modified embodiment of the invention
Figure 12:
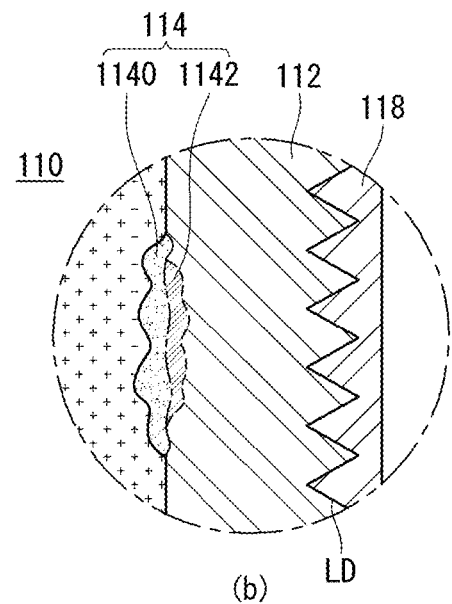
Figure 12:
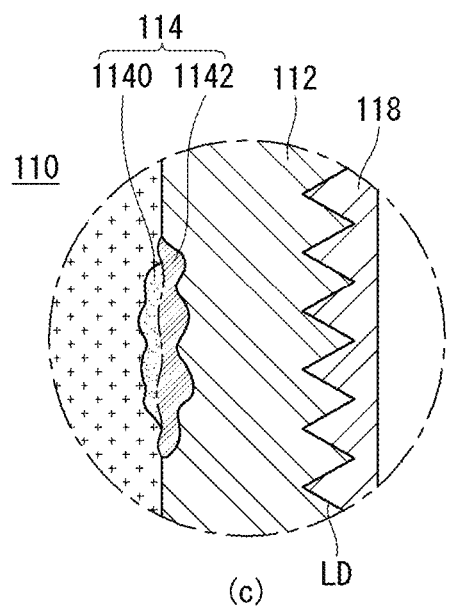

FIG. 12 is a partial cross-sectional view schematically showing various examples of a first cover member included in a solar cell panel according to another modified embodiment of the invention. In FIG, 12, a cross-sectional shape of a first base member 112, a background layer 1140, and a colored layer 1142 are schematically shown, and thus, voids 114V or so on is not shown and a shape of an interfacial surface or an outer surface are schematically shown.

Referring to FIG. 12, in the modified embodiment, a colored portion 114 may be positioned on an inner surface of the first base member 112. In this case, a colored layer 1142 may be positioned on an inner surface of the first base member 112, and a background layer 1140 may be positioned on the colored layer 1142. Then, the background layer 1140 may be positioned adjacent to a solar cell 150 than the colored layer 1142, and the colored layer 1142 may be positioned at a side of a direction in which light is incident and the background layer 1140 positioned backward the colored layer 1142. When the colored portion 114 is positioned on or at the inner surface of the first base member 112, a light diffusion portion LD may be formed at an outer surface of the first base member 112. In FIG. 12, it is exemplified that a protection layer 118 is formed on the light diffusion portion LD. The protective layer 118 may serve to protect an outer surface structure of the light diffusing portion LD and may serve as an anti-glare layer having an anti-glare effect. However, embodiments of the invention are not limited thereto and may not include the light diffusion portion LD and/or the protection layer 118.

For example, as shown in FIG. 12(a), a background layer 1140 and a colored layer 1142 which are stacked to each other may be formed so as to completely overlap with each other with the same area. As another example, as shown in FIG. 12(b), an area of a background layer 1140 may be larger than an area of the colored layer 1142 so that the background layer 1140 is formed so as to cover an inner surface and a side surface of the colored layer 1142 as a whole. As shown in FIG. 12(c), an area of the colored layer 1142 may be larger than that of the background layer 1140 so that an entire area of the background layer 1140 is positioned on a partial area of the colored layer 1142.

In the above-described embodiments, an entire portion of one of the background layer 1140 and the colored layer 1142 may overlap (for example, overlap and be in contact with) the other one of the background layer 1140 and the colored layer 1142. However, embodiments of the invention are not limited thereto. Another modified embodiment will be described with reference to FIG. 13.

Figure 13:
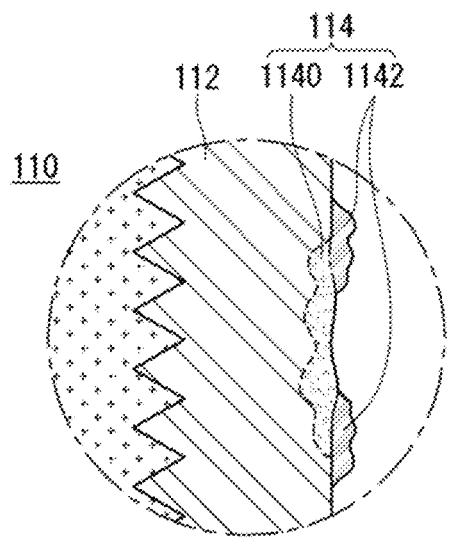
FIG. 13 is a partial cross-sectional view schematically showing various examples of a first cover member included in a solar cell panel according to still another modified embodiment of the invention
Figure 13:
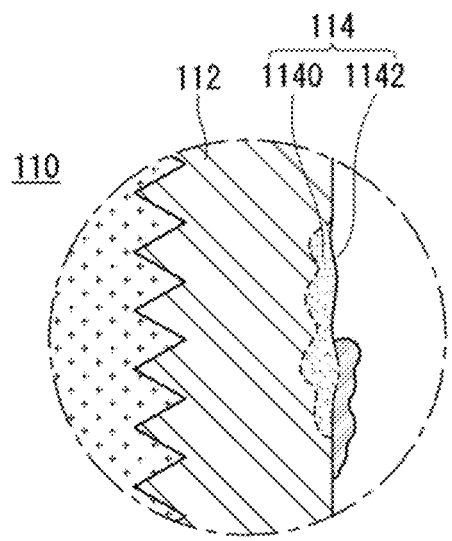
Figure 13:
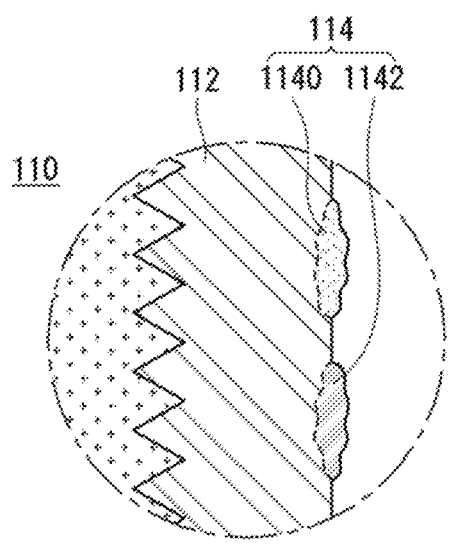
Figure 13:
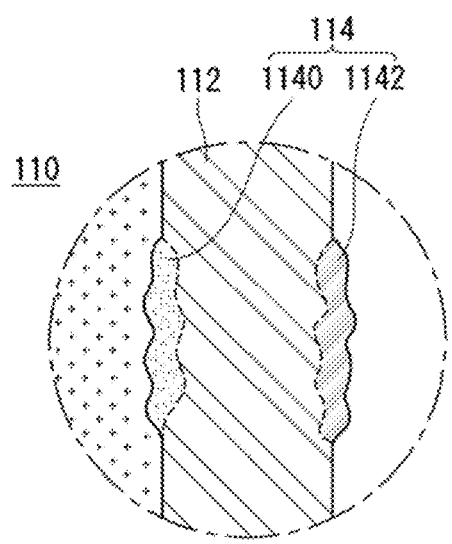

FIG. 13 is a partial cross-sectional view schematically showing various examples of a first cover member included in a solar cell panel according to still another modified embodiment of the invention. In FIG. 13, a cross-sectional shape of a first base member 112, a background layer 1140, and a colored layer 1142 are schematically shown, and thus, voids 114V or so on is not shown and a shape of an interfacial surface or an outer surface are schematically shown.

As shown in FIG. 13, in the modified embodiment, a part of one of a background layer 1140 and a colored layer 1142 may overlap (for example, overlap and be in contact with) a part of the other one of the background layer 1140 and the colored layer 1142, or the background layer 1140 and the colored layer 1142 may be spaced apart from each other but adjacent to each other.

More specifically, as shown in FIGS. 13(a) and FIG. 13(b), a part of a colored layer 1142 may overlap (for example, overlap and be in contact with) a part of a background layer 1140. For example, as shown in FIG. 13(b), a background layer 1140 may be formed at an entire region and a colored layer 1142 may be partially positioned. Alternatively, as shown in FIG. 13(c), a background layer 1140 and a colored layer 1142 may be positioned on or at the same surface but spaced from each other with no parts which overlap each other and thus a light transmission portion LTA (see FIG. 4) may be positioned between the background layer 1140 and the colored layer 1142. In FIG. 13(a), FIG. 13(b), and FIG. 13(c), it is exemplified that the background layer 1140 and the colored layer 1142 are positioned on or at an outer surface of the first base member 112. Alternatively, the background layer 1140 and the colored layer 1142 may be positioned on an inner surface of the first base member 112.

As another example, as shown in FIG. 13(d), a background layer 1140 and a colored layer 1142 may be positioned on or at opposite surfaces of the first base member 112, respectively. In one embodiment, it is exemplified that the colored layer 1142 is positioned at or on an outer surface and the background layer 1140 is positioned at or on an inner surface so that the background layer 1140 is adjacent to the solar cell 150 than the colored layer 1142 as viewed in a light incidence direction. However, embodiments of the invention are not limited thereto. Thus, a colored layer 1142 may be positioned on or at an inner surface and a background layer 1140 may be positioned on or at an outer surface. Also, in FIG. 13(d), it is exemplified that the background layer 1140 and the colored layer 1142 positioned at opposite surfaces are disposed so as to overlap with each other. Alternatively, a background layer 1140 and a colored layer 1142 may be not overlapped with each other, and thus, the background layer 1140 and the colored layer 1142 may be spaced apart from each other without being overlapped with each other but adjacent to each other.

In the above-described embodiments, it is exemplified that the background layer 1140 is partially formed at a portion corresponding to each colored portion 114 or each colored layer 1142. Alternatively, a background layer 1140 may be formed to correspond to a plurality of colored portions 114 or a plurality of colored layers 1142 and thus portions of the background layer 1140 corresponding to the plurality of colored portions 114 or the plurality of colored layers 1142 are connected to each other to form an integrated structure or a single portion. That is, a plurality of colored portions 114 or a plurality of colored layers 1142 may be positioned to overlap or be in contact with one background layer 1140.

In the above-described embodiments, it is exemplified that the colored portion 114 or the colored layer 1142 has one color as an example. However, embodiments of the invention are not limited thereto, and a colored portion 114 may includes a plurality of colored layers 1142 having different colors or different light transmittances. These embodiments and modified embodiments will be described with reference to FIGS. 14 to 22.

Figure 14:
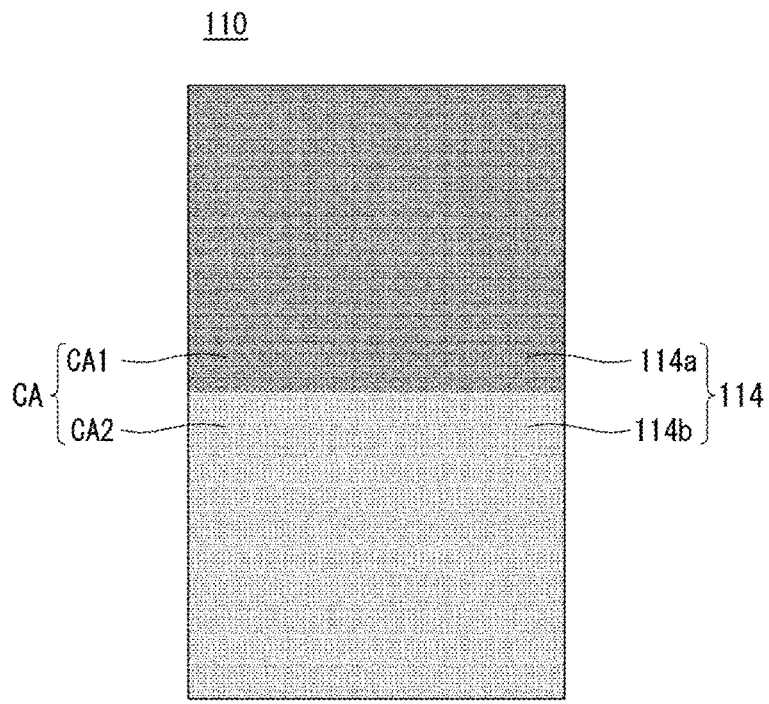
FIG. 14 is a plan view showing a first cover member included in a solar cell panel according to another embodiment of the invention.
Figure 15:
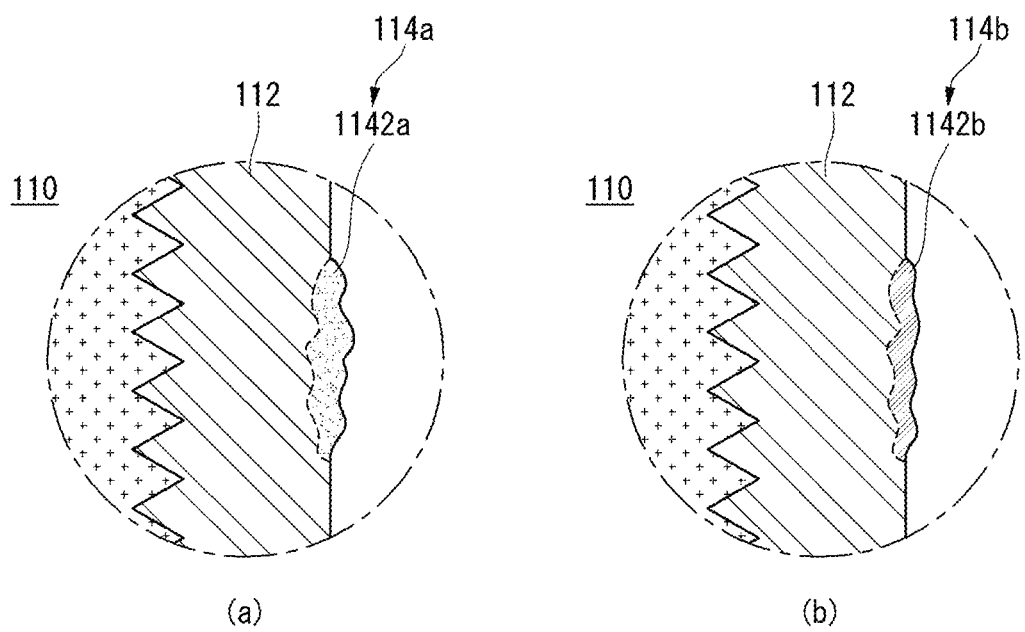
FIG. 15 is a partial cross-sectional view schematically showing a plurality of colored portions included in the first cover member shown in FIG. 14.

FIG. 14 is a plan view showing a first cover member included in a solar cell panel according to another embodiment of the invention, and FIG. 15 is a partial cross-sectional view schematically showing a plurality of colored portions included in the first cover member shown in FIG. 14. For simplicity, in FIG. 15, a cross-sectional shape of a first base member 112, a background layer 1140, and a colored layer 1142 are schematically shown, and thus, voids 114V or so on is not shown and a shape of an interfacial surface or an outer surface are schematically shown.

Referring to FIGS. 14 and 15, in the embodiment, a colored portion 114 may include a plurality of colored portions 114a and 114b having different colors, or the colored portion 114 may have a plurality of colored layers 1142a and 1142b having different colors. In this instance, the plurality of colored layers 1142a and 1142b may have different thicknesses in consideration of light transmittances. Then, in the case of including a plurality of colored layers 1142a and 1142b having different light transmittances, the light transmittances by the plurality of colored layers 1142a and 1142b or the plurality of colored portions 114a and 114b can be uniform.

For example, the plurality of colored portions 114 may include a first colored portion 114a including a first colored layer 1142a having a first color and having a first transmittance, and a second colored portion 114b including a second colored layer 1142b having a second color different from the first color and having a second transmittance lower than the first transmittance. In this instance, each of the first transmittance and the second transmittance may mean an average light transmittance with respect to a light having a wavelength of 100 nm to 1400 nm (for example, 100 nm to 1200 nm). In this instance, a thickness of the second colored layer 1142b may be smaller than a thickness of the first colored layer 1142a. According to this structure, even when a plurality of colored layers 1142a and 1142b or a plurality of colored portions 114a and 114b having different colors are provided, light transmittances can be uniformly maintained by a simple structure for controlling the thicknesses. Thus, an output and a stability of a solar cell panel 100 can be excellent.

In the embodiment, even when a plurality of colored portions 114 are provided, amounts of currents generated by a plurality of solar cells 150 can be the same or similar. For example, when a difference in amounts of currents generated by the plurality of solar cells 150 is 10% or less (10% or less based on 100% of a current of the solar cell 150 that generates the largest current). For example, when the first colored portion 114a is positioned to correspond to a first solar cell (positioned on the first solar cell when viewed in a plan view) of the plurality of solar cells 150 and the second colored portion 114b is positioned to correspond to a second solar cell (positioned on the second solar cell when viewed in a plan view), a difference between an amount of a first current generated by the first solar cell and an amount of a second current generated by the second solar cell is 10% or less (10% or less based on 100% of larger one of the first and second currents). Although the first and second colored portions 114a and 114b are exemplified, the same applies to the case where three or more colored portions 114 are provided. Further, it is exemplified that the first and second colored portions 114a and 114b correspond to different solar cells 150 in the above description. Alternatively, even when a plurality of colored portions 114 are positioned in one solar cell 150, an amount of a current generated by the one solar cell may be similar to an amount of a current generated by another solar cell 150 not including a colored portion 114 or another solar cell 150 having a colored portion 114 having a different form, shape, arrangement, or so on from the one solar cell 150 (for example, a different in a current is 10% or less). Accordingly, even when a plurality of colored portions 114 having different colors, structures, or the like, are provided, problems such as hot spots can be prevented from occurring and a reliability of the solar cell panel 100 can be enhanced.

In the embodiment shown in FIG. 15, thicknesses of the plurality of colored layers 1142a and 114b are different from each other, but embodiments of the invention are not limited thereto. Various modifications to this will be described in detail with reference to FIGS. 16 to 18. FIG.

Figure 16:
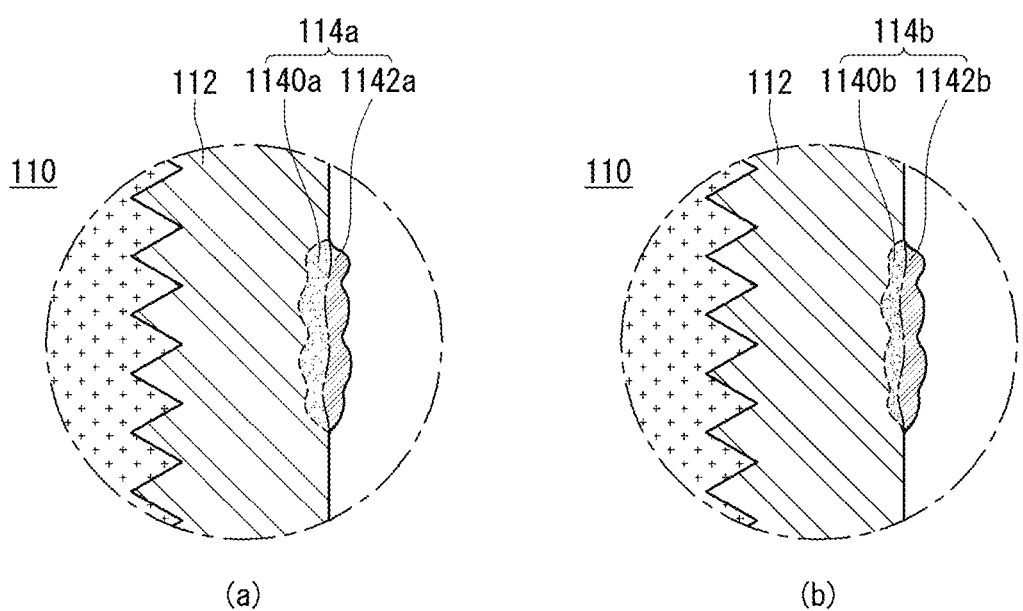
FIG. 16 is a partial cross-sectional view schematically showing a plurality of colored portions included in a first cover member included in a solar cell panel according to a modified embodiment of the invention.

FIG. 16 is a partial cross-sectional view schematically showing a plurality of colored portions included in a first cover member included in a solar cell panel according to a modified embodiment of the invention.

Referring to FIG. 16, in the modified embodiment, a colored portion 114 may include a plurality of colored portions 114a and 114b having different colors, or the colored portion 114 may have a plurality of colored layers 1142a and 1142b having different colors. In this instance, the plurality of colored portions 114a and 114b further include a plurality of background layers 1140a and 1140b, respectively, and the plurality of background layers 1140a and 1140b may have different thicknesses in consideration of light transmittances. Thus, in the case of having a plurality of colored layers 1142a and 1142b having different light transmittances, light transmittances by the plurality of colored portions 114a and 114b can be uniform.

For example, the plurality of colored portions 114 may include a first colored portion 114a and a second colored portion 114b. The first colored portion 114a may include a first colored layer 1142a having a first color and a first transmittance, and a first background layer 1140a. The second colored portion 114b may include a second colored layer 1142b having a second transmittance lower than the first transmittance and having a second color different from the first color and a second background layer 1140b. In this instance, a thickness of the second background layer 1140b may be smaller than a thickness of the first background layer 1140a. Then, by the relatively large thickness of the first background layer 1140a in the first colored portion 114a including the first colored layer 1142a having a relatively high light transmittance, the first colored portion 114a and the second colored portion 114b can have the same or similar light transmittances.

Figure 17:
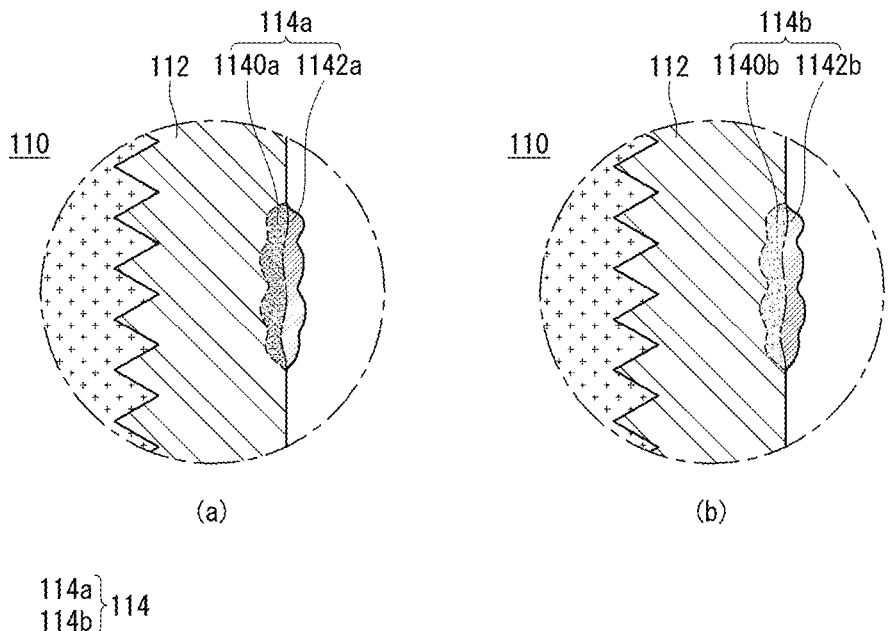
FIG. 17 is a partial cross-sectional view schematically showing a plurality of colored portions included in a first cover member included in a solar cell panel according to another modified embodiment of the invention.

As another example, as shown in FIG. 17, a first background layer 1140a may have a different material, a different color, or a different light transmittance from that of a second background layer 1140b. That is, a light transmittance of the second background layer 1140b may be higher than that of the first background layer 1140a.

For example, a brightness of the first background layer 1140a may be lower than that of the second background layer 1140b, or the first background layer 1140a may be darker than the second background layer 1140b. Alternatively, the first background layer 1140a and the second background layer 1140b may be transparent or translucent, and a transparency of the first background layer 1140a may be lower than that of the second background layer 1140b. Alternatively, the second background layer 1140b may be transparent or translucent and the first background layer 1140a may have a certain color (e.g., a white-based color or a yellow-based color). Then, by the relatively low light transmittance of the first background layer 1140a in the first colored portion 114a including the first colored layer 1142a having a relatively high light transmittance, the first colored portion 114a and the second colored portion 114b can have the same or similar light transmittances.

Figure 18:
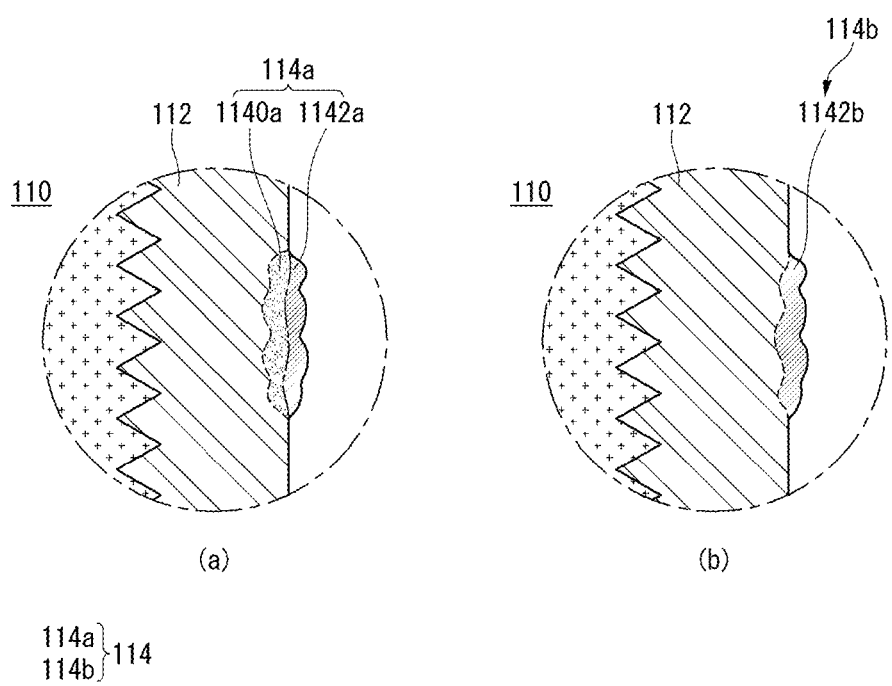
FIG. 18 is a partial cross-sectional view schematically showing a plurality of colored portions included in a first cover member included in a solar cell panel according to yet another modified embodiment of the invention.

As another example, as shown in FIG. 18, a first colored portion 114a may include a first background layer 114a, while the second colored portion 114b does not include a background layer and includes only a second colored portion 1142b. Then, the first colored portion 114a including the first colored layer 1142a having a relatively high light transmittance and the second colored portion 114b including the second colored layer 1142b having a relatively low light transmittance can have the same or similar light transmittances.

By a simple structure in which thicknesses and colors of background layers 1140a and 1140b and existence or non-existence of the background layers 1140a and 1140b are different or controlled, light transmittances can be uniform even when a plurality of colored layers 1142a and 1142b or a plurality of colored portions 114a and 114b having different colors or light transmittances are provided. Thus, an output and a stability of the solar cell panel 100 can be excellent.

In FIGS. 14 to 18, it is exemplified that first and second cover areas CA1 and CA2 having different colors are formed by first and second colored portions 114a and 114b having different colors as an example. In addition, it is exemplified that a plurality of colored portions 114 having different colors are independently positioned and a plurality of cover areas CA corresponding them are independently positioned. Also, it is exemplified that a plurality of cover areas CA are disposed on an entire portion of the first cover member 110. However, embodiments of the invention are not limited to a number of the colored portions 114, a shape, a color, a number, an arrangement, or so on of the cover areas CA, and various modifications are possible. For example, a plurality of colored portions 114 or a plurality of cover areas CA may be overlapped with each other, or a plurality of cover areas CA may be entirely spaced apart to form a portion where the cover areas CA are not formed. Various variations are possible.

Also, in FIGS. 14 to 18, it is exemplified that the colored portion 114 is positioned on or at an outer surface of the first base member 112. However, as shown in FIGS. 11 to 13, a colored portion 114 may be formed of any of various shapes at any of various positions. Further, in FIGS. 14 to 18, it is exemplified that only one of thicknesses of a plurality of colored layers 1142a and 1142b, thicknesses and light transmittances of background layers 1140a and 1140b, and the presence or absence of the background layers 1140a and 1140b is different. However, a plurality of them may be different from each other. In addition, in FIGS. 14 to 18, it is exemplified that the background layers 1140a and 1140b are partially formed at portions corresponding to colored portions 114 or the colored layers 1142, respectively. Alternatively, a background layer 1140 may be formed to correspond to a plurality of colored portions 114 or a plurality of colored layers 1142 and thus portions of the background layer 1140 corresponding to the plurality of colored portions 114 or the plurality of colored layers 1142 are connected to each other to form an integrated structure or a single portion. That is, a plurality of colored portions 114 or a plurality of colored layers 1142 may be positioned to overlap or be in contact with one background layer 1140, and a thickness of the background layer may be different at each of the colored portions 114a and 114b in consideration of the light transmittances of the plurality of colored layers 1142a and 1142b. Alternatively, a thickness of a background layer at portions where colored portions 114a and 114b or the colored layers 1142a and 1142b are present may be thinner than a thickness of a background layer at the portion where the colored portions 114a and 114b are not positioned. Various other variations are possible.

In FIGS. 16 to 18, it is exemplified that the colored portion 114 is partially positioned in the cover area CA, but embodiments of the invention are not limited thereto. Therefore, the colored portion 114, the background layer 1140, or the colored portion 1142 may be formed at an entire area of the cover area CA.

Also, in the above-described embodiments, it is exemplified that a plurality of colored portions 114a and 114b are used to realize separate colors or cover areas CA. However, a plurality of colored portions 114a and 114b may be positioned together at one colored unit to realize one color. This will be described in detail with reference to FIGS. 19 to 23.

Figure 19:
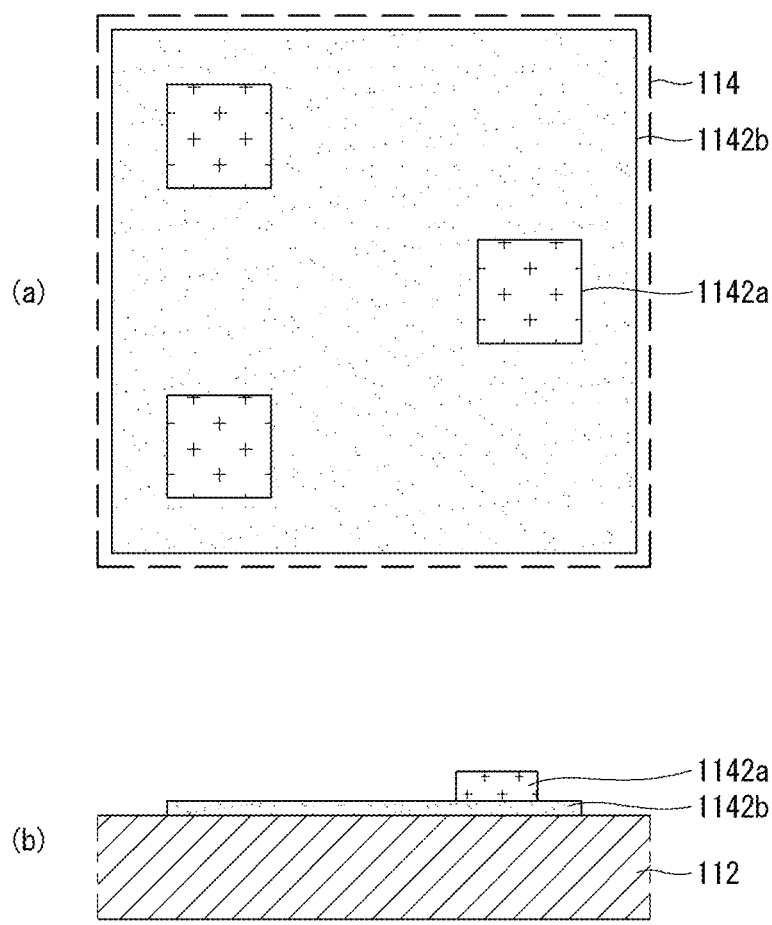
FIG. 19 is a view showing an example of each colored unit included in a first cover member included in a solar cell panel according to yet still another embodiment of the invention.

FIG. 19 is a view showing an example of each colored unit included in a first cover member included in a solar cell panel according to still another embodiment of the invention. The colored unit in FIG. 19 may correspond to one colored portion 114 shown in FIG. 4(a).

Referring to FIG. 19, in the embodiment, a colored portion 114 may be formed of a colored unit including at least two colored layers 1142a and 1142b having different colors or different light transmittances. That is, the at least two colored layers 1142a and 1142b may be positioned in each of the colored portions 114 or colored units, which are positioned at 1 to 100 dpi in a cover area (for example, a colored area). The colored unit may be positioned at 1 to 100 dpi to realize a cover area having a desired color. This will be explained in more detail.

In the embodiment, each of the colored portions 114 or the colored units may include a first colored layer 1142a having a first color and having a first transmittance, and a second colored layer 1142b having a second color different from the first color and having a second transmittance higher than the first transmittance. In this instance, the first color of the first colored layer 1142a may be a color that can realize one of three primary colors (that is, red, yellow, and green) alone or in combination with another color, a black color, or a white color. The second colored layer 1142b may have a higher light transmittance than the first colored layer 1142a and may have a color different from that of the first colored layer 1142a (e.g., a color having a different brightness and/or a different saturation). For example, when the first colored layer 1142a is yellow, the second colored layer 1142b may be formed of white so that the yellow color can be more clearly realized. Alternatively, when the first colored layer 1142a is white, the second colored layer 1142b may be formed of yellow so that the yellowish white can be realized more clearly. In addition, it is possible to realize a primary color such as red, green, and blue.

For example, for a light in a visible light region (a light having a wavelength of 380 to 760 nm as one example), a light transmittance (for example, an average light transmittance) of the first colored layer 1142a may be 60% or less (for example, 0 to 60%), and a light transmittance (for example, an average light transmittance) of the second colored layer 1142b may be 90% or less, more specifically 80% or less (as an example, 0 to 90%, specifically 0 to 80%). However, embodiments of the invention are not limited thereto.

In the embodiment, the first colored layer 1142a may realize a desired color and a portion where a relatively small amount of light is transmitted to perform auxiliary power generation. The second colored layer 1142b may be a portion for assisting to realize a desired color and for preventing a glare phenomenon, and a portion that has a great influence on power generation because a relatively large amount of a light is transmitted to generate enough power. That is, the second colored layer 1142b may serve as a background layer. An area ratio of the second colored layer 1142b may be the same as or larger than an area ratio of the first colored layer 1142a so that the desired color can be realized while sufficiently generating electricity. For example, the area ratio of the first colored layer 1142a : the second colored layer 1142b may be 1:9 to 5:5. However, embodiments of the invention are not limited thereto and various modifications are possible. For example, the first and second colored layers 1142a and 1142b may have colors other than white to realize specific colors, respectively, that is, the second colored layer 1142b may be a colored layer not a background layer.

In FIG. 19, it is exemplified that the second colored layer 1142b is formed entirely at the colored portion 114, and a plurality of first colored layers 1142a are partially formed at the colored portion 114, and an entire portions of the plurality of first colored layers 1142a are overlapped with the second colored layer 1142b on the second colored layer 1142b. However, a planar shape, a stacked structure, etc. of the first colored layer 1142a and the second colored layer 1142b are not limited to those shown in FIG. 19, and various modifications are possible. This will be described in detail with reference to FIGS. 20 and 21.

Figure 20:
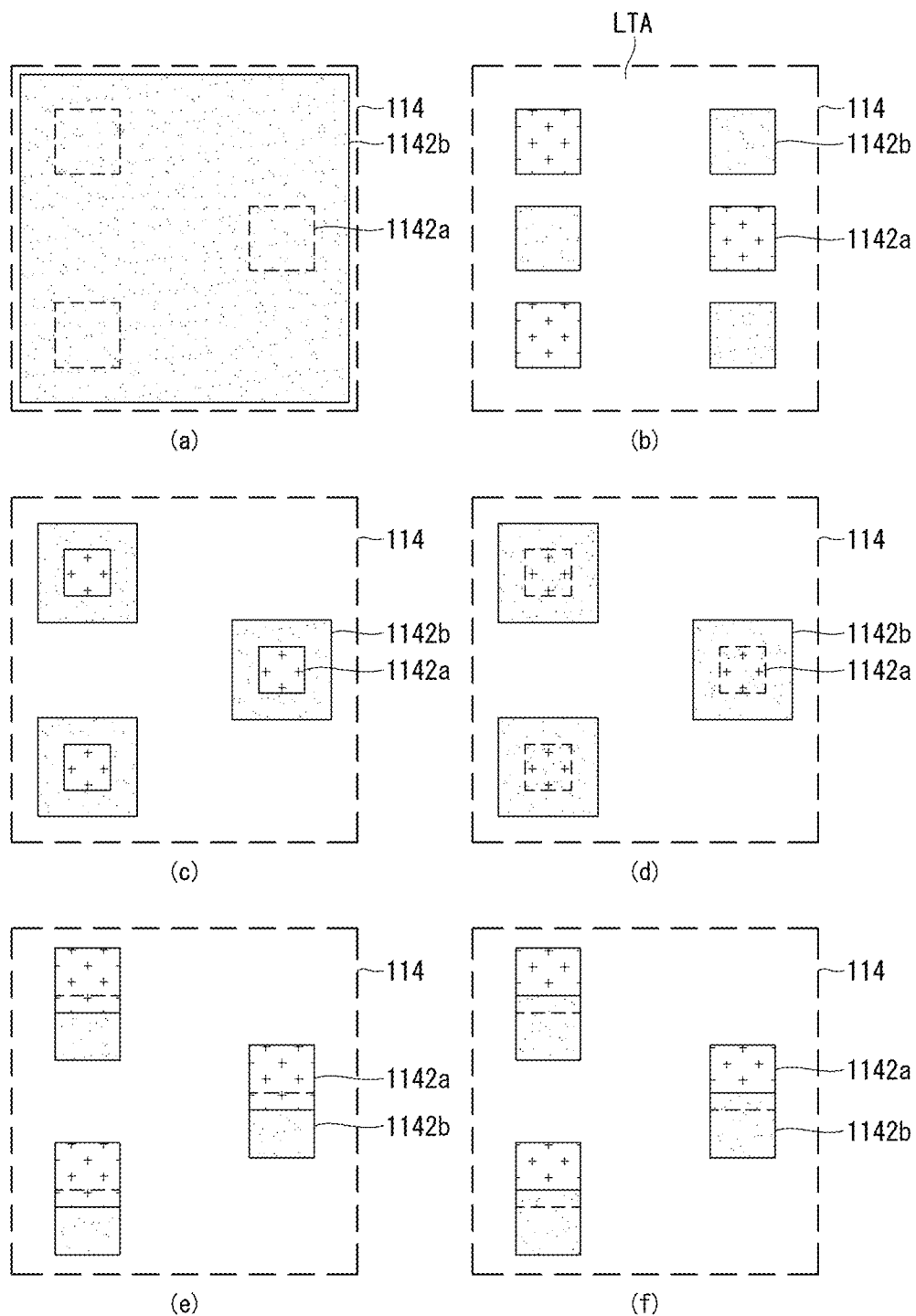
FIG. 20 is a partial plan view showing various examples of each colored unit of a first cover member included in a solar cell panel according to a modified embodiment of the invention.
Figure 21:
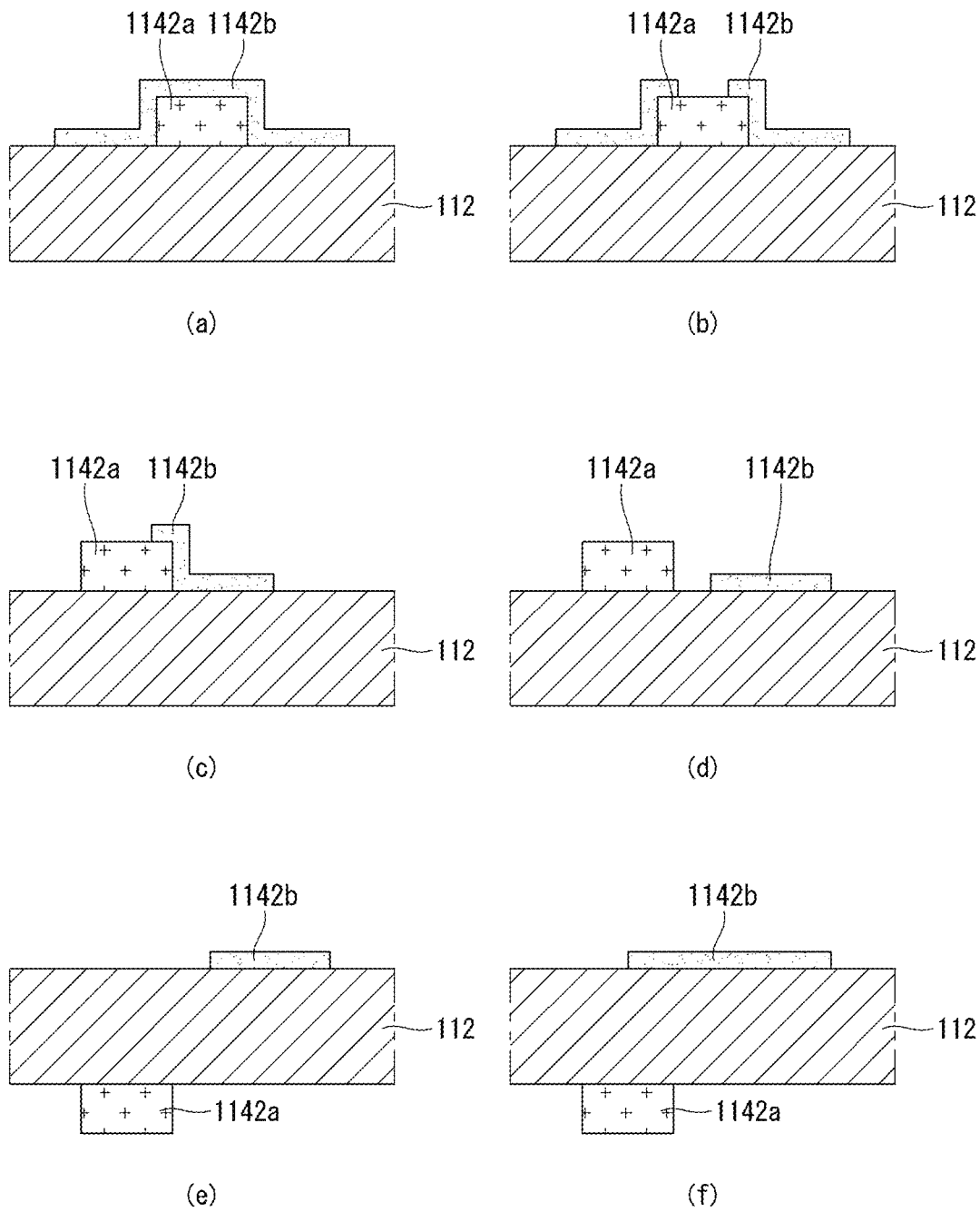
FIG. 21 a partial cross-sectional view showing various examples of a first cover member included in a solar cell panel according to an embodiment of the invention.

FIG. 20 is a partial plan view showing various examples of each colored unit of a first cover member included in a solar cell panel according to a modified embodiment of the invention. FIG. 21 a partial cross-sectional view showing various examples of a first cover member included in a solar cell panel according to an embodiment of the invention. For simplicity, in FIGS. 20 and 21, a cross-sectional shape of a first base member 112, a background layer 1140, and a colored layer 1142 are schematically shown, and thus, voids 114V or so on is not shown and a shape of an interfacial surface or an outer surface are schematically shown.

As shown in FIG. 20(a), a plurality of first colored layers 1142a may be partially formed inside a colored portion 114 or inside a colored unit, and a second colored layer 1142b may entirely cover the plurality of first colored layers 1142a and may be positioned at an entire portion of the colored portion 114 or the colored unit.

Alternatively, as shown in FIG. 20(b), a plurality of first colored layer 1142a and a plurality of second colored layer 1142b may be spaced apart without overlapping each other and may be partially formed in each colored portion 114 or each colored unit.

Alternatively, as shown in FIGS. 20(c) and 20(d), a plurality of first colored layer 1142a and a plurality of second colored layer 1142b may be partially formed and an entire portion of the first colored layer 1142a may overlap the second colored layer 1142b in each colored portion 114 or each colored unit. In this instance, the first colored layer 1142a may be positioned on the second colored layer 1142b as shown in FIG. 20(c), or the second colored layer 1142b may be positioned on the first colored layer 1142a as shown in FIG. 20(d).

Alternatively, as shown in FIGS. 20(e) and 20(f), a plurality of first colored layer 1142a and a plurality of second colored layer 1142b may be partially formed and a part of the first colored layer 1142a may overlap the second colored layer 1142b in each colored portion 114 or each colored unit. In this instance, the first colored layer 1142a may be positioned on the second colored layer 1142b in each colored portion 114 or each colored unit as shown in FIG. 20(e), or the second colored layer 1142b may be positioned on the first colored layer 1142a in each colored portion 114 or each colored unit as shown in FIG. 20(f).

Meanwhile, as shown in FIG. 21(a), a second colored layer 1142b may be formed on an entire portion of a first colored layer 1142a in each colored portion 114 or each colored unit. Alternatively, as shown in FIG. 21(b) and FIG. 21(c), a part of a second colored layer 1142b may be formed on a part of a first colored layer 1142a in each colored portion 114 or each colored unit. Alternatively, as shown in FIG. 21(d) to FIG. 21(f), a first colored portion 1142a and a second colored layer 1142b are spaced apart from each other without an overlapping portion and thus a light transmission portion LTA may be positioned therebetween. In this instance, the first colored layer 1142a and the second colored layer 1142b may be positioned on the same surface in each colored portion 114 or each colored unit as shown in FIG. 21(d), of the first colored layer 1142a and the second colored layer 1142b may be positioned at opposite surfaces in each colored portion 114 or each colored unit as shown in FIG. 21(e) and FIG. 21(f). In this instance, the first colored layer 1142a and the second colored layer 1142b may be spaced apart from each other even when viewed in a plan view as shown in FIG. 21(e), or the first colored layer 1142a and the second colored layer 1142b may have an overlapped portion when viewed in a plan view as shown in FIG. 21(f). For reference, an effect of the first colored layer 1142a and the second colored layer 1142b can be maximized when the first colored layer 1142a and the second colored layer 1142b are positioned toward an outer surface. However, embodiments of the invention are not limited thereto.

Figure 22:
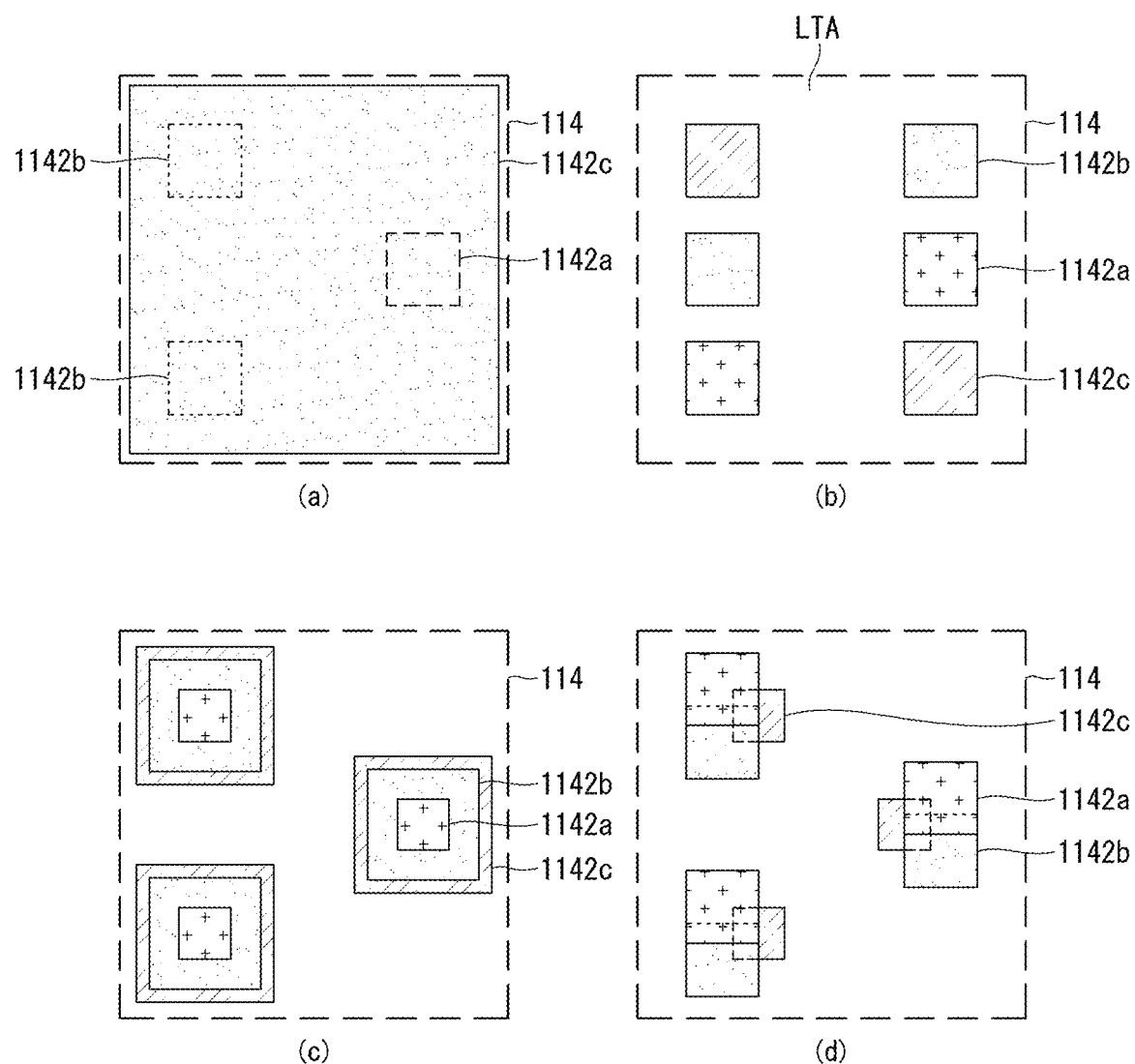
FIG. 22 a partial cross-sectional view showing various examples of a first cover member included in a solar cell panel according to an embodiment of the invention.

In another embodiment, as shown in FIG. 22, a colored portion 114 or the colored unit may further a third colored layer 1142c having a third color having a higher brightness than a first color and a second color and having a higher transmittance than first and second layers 1142a and 1142b. In this instance, the first color and the second color of first and second colored layers 1142a and 1142b are mixed to be recognized by a user in a different color. The third colored layer 1142c may be a portion for assisting to realize a primary color to be realized by the first color and/or the second color more clearly, or for preventing undesired darkening of the colored portion 114. That is, the third colored layer 1142c may serve as a background layer. As another example, the third colored layer 1142c may be formed of a color other than white (e.g., another one of three primary colors) so that colors of first to third colored layers 1142a, 1142b, and 1142c are mixed to be recognized as one color by a user.

In one example, the third color may have a white-based color or a yellow-based color. In this instance, a white-based or a yellow-based color may mean white, yellow, or a color which is basically white or yellow, mixed with slightly different colors and considered to be white or yellow as a whole. Then, the third colored layer 114c can sufficiently perform an act as a background layer for preventing portions where the first and/or second colored layers 114a and 114b are positioned from being undesirably darkened or for realizing a color by the first and/or the second colored layers 114a and 114b more clearly.

As described above, when the colored portion 114 or the colored unit includes the first colored layer 1142a and the second colored layer 1142b, and optionally the third colored layer 1142c, an effect of preventing a glare phenomenon can be further improved.

In this instance, when the colored unit does not include a light transmitting portion LTA as shown in FIG. 22(a), an area of the third colored layer 1142c (for example, a background layer) may be greater than a sum of an area of the first colored layer 1142a and an area of the second colored layer 1142b. According to this, the third colored layer 1142c can maximize an effect of improving brightness and an anti-glare effect. Alternatively, an area of the first colored layer 1142a, an area of the second colored layer 1142b, and an area of the third colored layer 1142c may be the same as each other. In FIG. 22(a), it is exemplified that the first and second colored layers 1142a and 1142b are disposed under the third colored layer 1142c. However, a stacked structure of the first to third colored layers 1142a, 1142b, and 1142c may be variously modified.

As another example, when the colored unit includes a light transmitting portion LTA as shown in FIG. 22(b) to FIG. 22(f), a total area of the first colored layer 1142a and the second colored layer 1142b, and the third colored layer 1142c (for example, a background layer) may be the same as or greater than an area of the light transmitting portion LTA. According to this, sufficient power generation can be achieved by the light transmitting portion LTA. For example, as shown in FIG. 22(b), an area of the first colored layer 1142a, an area of the second colored layer 1142b, and an area of the third colored layer 1142c may be the same as each other.

As shown in FIG. 22(b), the first to third colored layers 1142a, 1142b, and 1142c may be positioned at positions spaced from each other. Alternatively, all or a part of the first to third colored layers 1142a, 1142b, and 1142c may be overlapped with each other as shown in FIGS. 22(c) and 22(d). A stacked structure of the first to third colored layers 1142a, 1142b, and 1142c may be variously modified.

As another example, it is possible to further include one or more colored layers or background layers having a different color or a different light transmittance from the first to third colored layers 1142a, 1142b, and 1142c.

Figure 23:
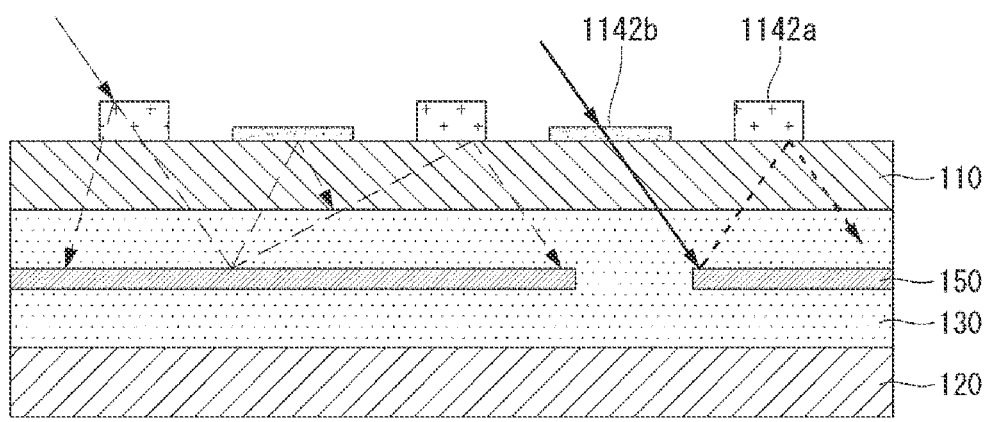
FIG. 23 is a schematic view showing a part of a solar cell panel including a first cover member having a first colored layer and a second colored layer according to yet still another embodiment of the invention.

FIG. 23 is a schematic view showing a part of a solar cell panel 100 including a first cover member 110 having a first colored layer 1142a and a second colored layer 1142b according to yet still another embodiment of the invention. It is shown that the first colored layer 1142a and the second colored layer 1142b are separate layers from a first base member 112 for simplicity. However, the first colored layer 1142a or the second colored layer 1142b may be a portion integrated with the first base member 112 as shown in FIG. 3.

Referring to FIG. 23, in the embodiment, a second colored layer 1142b having higher light transmittance than a first colored layer 1142a is included so that the light is smoothly transmitted through the second colored layer 1142b. The light reflected by the solar cell 150 and directed toward the front surface is at least partially scattered by the second colored layer 1142b, thereby minimizing a glare phenomenon at the front surface of the solar cell panel 100. In this instance, the light transmittance of the second colored layer 1142b is higher than that of the first colored layer 1142a, and thus, an output reduction by the colored portion 114 can be minimized. In addition, the second colored layer 1142b can further prevent the solar cell 150 from being seen outside.

Figure 24:
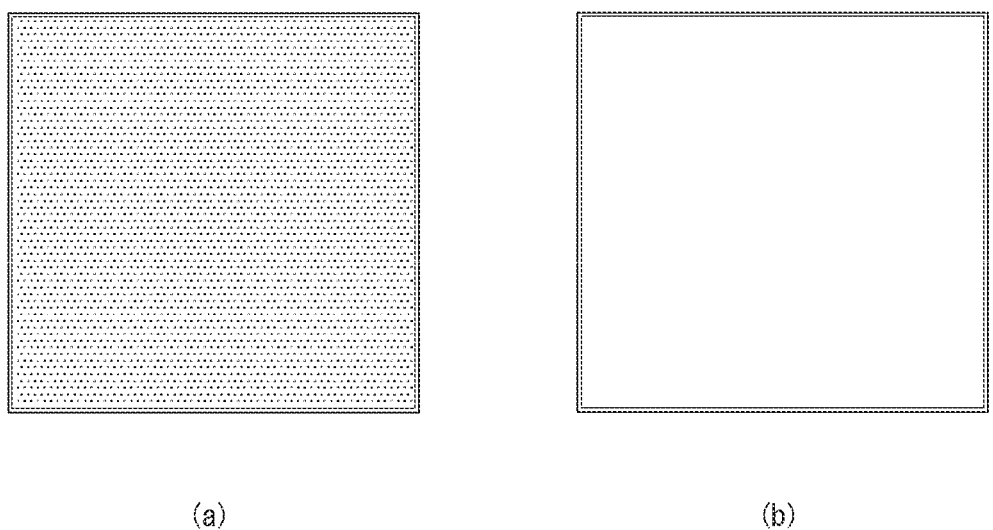
FIG. 24 shows a photograph of a solar cell panel according to an embodiment of the invention and a photograph of the conventional solar cell panel when a light is irradiated.

This will be described in more detail with reference to FIG. 24. FIG. 24(a) shows a photograph of a solar cell panel having a first cover member 110 having first and second colored layers 1142a and 1142b according to the embodiment when a light is irradiated. FIG. 24(b) shows a photograph of the conventional solar cell panel which does not have a colored layer or a colored portion when a light is irradiated.

It can be seen that a glare phenomenon generates very little in the solar cell panel 100 according to the embodiment as shown in FIG. 24(a), while a glare phenomenon generates greatly in the conventional solar cell panel as shown in FIG. 24(b).

Figure 25:
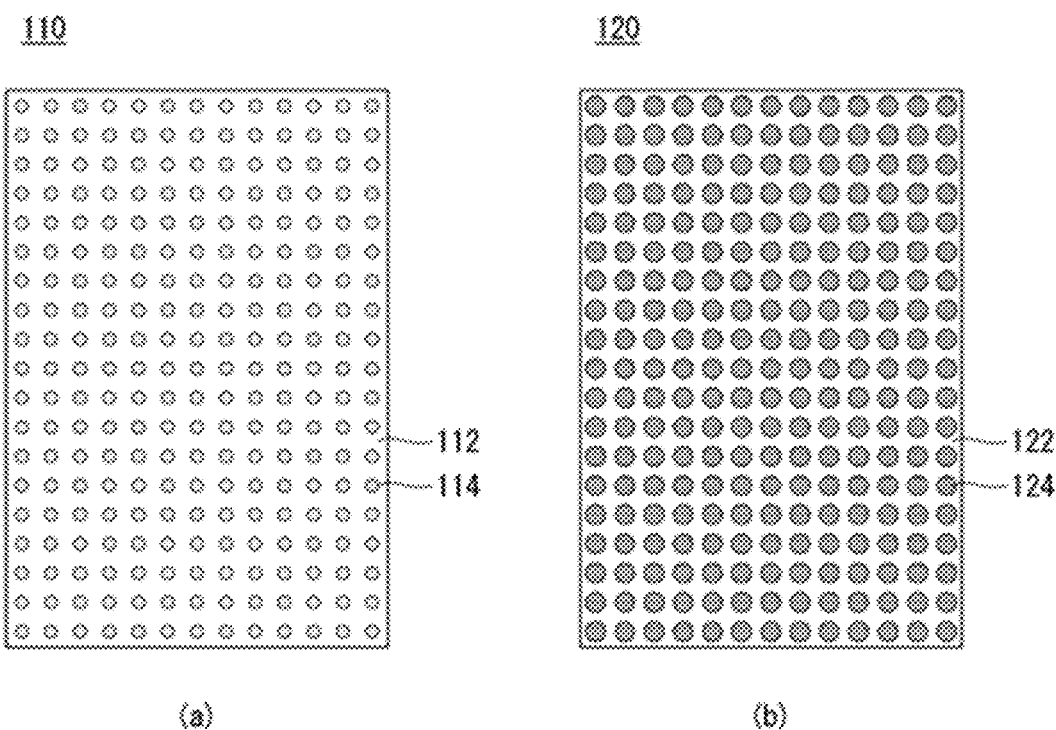
FIG. 25 is a plan view showing an example of a first cover member and a second cover member included in a solar cell panel according to yet still another embodiment of the invention.
Figure 26:
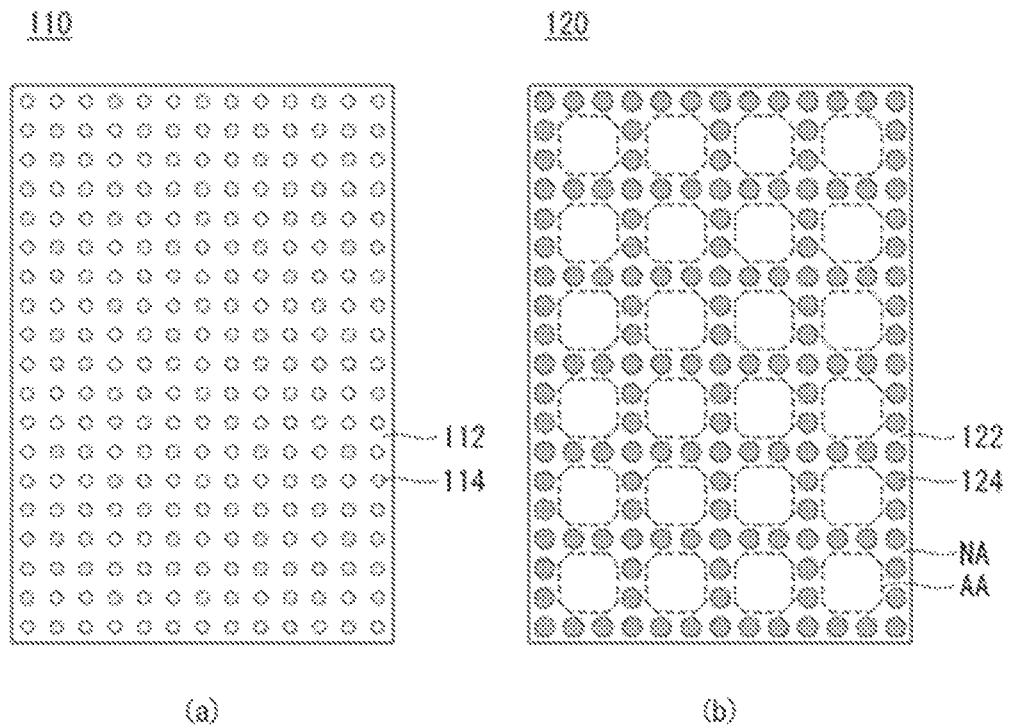
FIG. 26 is a plan view showing another example of a first cover member and a second cover member included in a solar cell panel according to yet still another embodiment of the invention.
Figure 27:
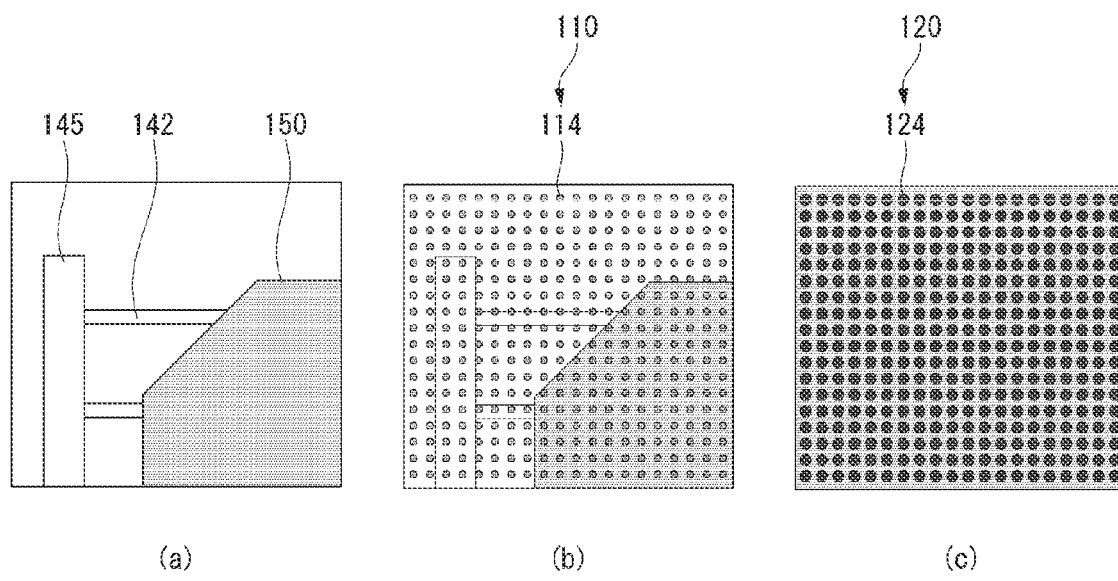
FIG. 27 is a photograph of a part of an example of a solar cell panel according to an embodiment of the invention.

FIG. 25 is a plan view showing an example of a first cover member 110 and a second cover member 120 included in a solar cell panel 100 according to yet still another embodiment of the invention. FIG. 26 is a plan view showing another example of a first cover member 110 and a second cover member 120 included in a solar cell panel 100 according to yet still another embodiment of the invention. FIG. 26 is a plan view showing an example of a first cover member 110 and a second cover member 120 included in a solar cell panel 100 according to yet still another embodiment of the invention. FIG. 27 is a photograph of a part of an example of a solar cell panel 100 according to an embodiment of the invention. It is shown the colored portion 114 and the cover portion 124 have a circular dot as an example, but embodiments of the invention are not limited thereto.

Referring to FIGS. 25 and 26, in the embodiment, the cover portion 124 may have a brightness or a light transmission smaller than that of the colored portion 114, and/or a second cover ratio may be greater than a first cover ratio. For example, the brightness of the cover portion 124 may be lower than that of the colored portion 114, or the second cover ratio may be lower than the first cover ratio when the cover portion 124 has a color of the same color as or a color having brightness lower than that of the colored portion 114.

In this instance, the relatively low brightness may mean brightness lower than brightness of the colored portion 114, and the relatively low light transmittance may mean a light transmittance lower than a light transmittance of the first base member 112 and/or the second base member 122.

The cover portion 124 may have an achromatic color other than white, an opaque color, or a color of the same series as that of the solar cell 150. For example, a color of the cover portion 124 may be black, gray, blue, green, brown, the color of the same series as that of the solar cell 150, or a mixed color thereof. Since white has a high brightness, it may be difficult to form the cover portion 124 by using it. For example, when the cover portion 124 is formed of the color of the same series as that of the solar cell 150, a color uniformity is achieved and the solar cell panel 100 has uniformity of color as a whole, thereby further improving an aesthetic property. However, embodiments are not limited thereto. Any of various colors other than the above-mentioned color, which has brightness lower than that of the colored portion 114 or a light transmittance lower than that of the first base member 112 and/or the second base member 122, may be used.

The first cover ratio may refer to a ratio of an area of the colored portion 114 (for example, a colored layer 1142) to an area of the cover area and the second cover ratio may refer to a ratio of an area of the cover portion 124 positioned at an inactive area NA to an area of the inactive area NA.

According to this, since the cover portion 124 positioned at the inactive area NA where the solar cell 150 is not positioned has a lower brightness or a larger cover ratio than the colored portion 114, the boundary of the solar cell 150, the interconnector 142 and 145, or the like can be prevented from being recognized.

That is, when, on the solar cell 150 and the interconnector 142 and 145 as shown in FIG. 27(a), the first cover member 110 having the colored portion 114 is positioned as shown in FIG. 27(b), the color of the colored portion 114 can be recognized while the boundary of the solar cell 150 and the boundary of the interconnectors 142 and 145 may be recognized to some degree. In this state, when the second cover member 120 having the cover portion 124 is put together as shown in FIG. 27(c), the color of the colored portion 114 is recognized and the boundary of the solar cell 150 and the boundary of the interconnector 142 and 145 are difficult to be recognized by interference of the colored portion 114 and the cover portion 124.

In the embodiment, a shield member having a shape that shields the interconnectors 142 and 145 may be positioned between the solar cell 150 and the interconnectors 142 and 145 and the first sealing member 130. In one example, a shield member may positioned at a portion to shield a first interconnector 142 positioned between adjacent solar cells 150 and/or a second interconnector 145 (e.g., a bus ribbon) that is connected to a plurality of solar cell strings at ends of the plurality of solar cell strings. The shield member may have a specific color (e.g., black, gray, or a color that is the same or similar to a color of a solar cell 150), and be formed of a material that has a different reflectivity from that of the interconnectors 142 and 145 and does not completely block the light. The shield member may be cohered to the solar cell 150 or the like. In this instance, the term of "cohesion" refers to a bonding force at which two layers can be attached or separated from each other by physical force at room temperature. The term of "cohesion" is different from an adhesion. By an adhesion, two layers are bonded to each other through a heat treatment, and thus, one of two layers is damaged when the two layers are separated. When the shield member is fixed to the solar cell 150 or the like by cohesion, it is easy to adhere, detach, or adjust a position of the shield member during a manufacturing process. A shape, a structure, a material, etc. of the shield member may be variously modified. Alternatively, interconnects 142 and 145 having a certain color (e.g., black, gray, etc.) may be used. Thus, it is possible to more effectively prevent a boundary of the interconnectors 142 and 145 from being recognized. As an example, the second cover ratio may be 0.5 to 1. That is, the ratio of the area of the cover portion 124 formed at the inactive area NA to the total area of the inactive area NA may be 0.5 to 1. Within the range of the second cover ratio, it is possible to effectively prevent the boundary of the solar cell 150 from being recognized or the interconnector 142 and 145 or the like from being recognized. However, embodiments of the invention are not limited thereto.

As an example, the second cover member 120 may be formed as a whole so as to correspond to the active region AA and the inactive area NA as shown in FIG. 25. Alternatively, the second cover portion 124 may be formed only at a portion corresponding to the inactive area NA and not be formed at the active region AA as shown in FIG. 26.

When the cover portion 124 is not formed in the active region AA, a cost for forming the cover portion 124 can be reduced.

In an exemplary embodiment, the cover portion 124 having a dot shape is placed on the second base member 122 in FIGS. 25 and 26. However, embodiments are not limited thereto. For example, the cover portion 124 may be entirely positioned on the second base member 122.

The features, structures, effects and the like according to the above-described embodiments are included in at least one embodiment of the invention and are not necessarily limited to one embodiment. Further, the features, structures, effects and the like illustrated in the embodiments can be combined and modified by other persons skilled in the art to which the embodiments belong. Therefore, it is to be understood that embodiments of the invention are not limited to these embodiments.

What is claimed is:

1. A solar cell panel comprising:
a solar cell;
a sealing member for sealing the solar cell;
a first cover member disposed on the sealing member at a front side of the solar cell; and
a second cover member disposed on the sealing member at a back side of the solar cell,
wherein the first cover member includes a base member formed of glass and a colored portion having a light transmittance lower than a light transmittance of the base member, the colored portion constituting a colored area,
wherein the colored portion includes at least two layers each formed of an oxide ceramic composition having a glass structure of an amorphous state and different light transmittances, and
wherein the colored portion is fused to the base member, thereby a portion of the colored portion is embedded in the base member.

2. The solar cell panel of claim 1, wherein an average light transmittance of the colored portion with respect to light in an infrared region is greater than or equal to an average light transmittance of the colored portion with respect to light in a visible light region.

3. The solar cell panel of claim 1, wherein the at least two layers included the colored portion include a first layer disposed on the base member, and a second layer disposed on the first layer,
wherein the first layer and the second layer each include voids, and
wherein a size of the voids included in the first layer is smaller than a size of the voids included in the second layer or a total volume of the voids included in the first layer is less than a total volume of the voids included in the second layer.

4. The solar cell panel of claim 1, wherein the colored portion includes a background layer and a colored layer stacked on each other or formed adjacent to each other.

5. The solar cell panel of claim 4, wherein the background layer has a brightness or a light transmittance greater than a brightness or a light transmittance of the colored layer, or
wherein the background layer has a white-based color or a yellow-based color, or is transparent or translucent.

6. The solar cell panel of claim 4, wherein the solar cell includes a plurality of solar cells, and
wherein at least a part of the background layer or at least a part of the colored layer is disposed at an inactive area where the plurality of solar cells are not located.

7. The solar cell panel of claim 4, wherein the background layer is closer to the solar cell than the colored layer.

8. The solar cell panel of claim 1, wherein the colored portion is formed at one surface of the first cover member and a light diffusion portion is formed at another surface of the first cover member.

9. The solar cell panel of claim 1, wherein the at least two layers included the colored portion include a first layer disposed on the base member, and a second layer disposed on the first layer, and
wherein the portion of the colored portion embedded in the base member is a portion of the first layer.

10. The solar cell panel of claim 9, wherein the colored portion is formed at one surface of the first cover member and a light diffusion portion is formed at another surface of the first cover member.

11. The solar cell panel of claim 10, wherein the first layer and the second layer each include voids, and
wherein a size of the voids included in the first layer is smaller than a size of the voids included in the second layer or a total volume of the voids included in the first layer is less than a total volume of the voids included in the second layer.

12. The solar cell panel of claim 10, wherein the colored portion is formed at one surface of the first cover member and a light diffusion portion is formed at another surface of the first cover member.

13. The solar cell panel of claim 4, wherein the portion of the colored portion embedded in the base member is a portion of the background layer.

14. The solar cell panel of claim 13, wherein the background layer has a brightness or a light transmittance greater than a brightness or a light transmittance of the colored layer, or
wherein the background layer has a white-based color or a yellow-based color, or is transparent or translucent.

15. The solar cell panel of claim 13, wherein the solar cell includes a plurality of solar cells, and
wherein at least a part of the background layer or at least a part of the colored layer is disposed at an inactive area where the plurality of solar cells are not located.

16. The solar cell panel of claim 13, wherein the background layer is closer to the solar cell than the colored layer.

17. The solar cell panel of claim 13, wherein the colored portion is formed at one surface of the first cover member and a light diffusion portion is formed at another surface of the first cover member.

* * * * *